(12) United States Patent
Mezic et al.

(10) Patent No.: US 9,043,163 B2
(45) Date of Patent: May 26, 2015

(54) SYSTEMS AND METHODS FOR ANALYZING BUILDING OPERATIONS SENSOR DATA

(75) Inventors: Igor Mezic, Goleta, CA (US); Bryan A. Eisenhower, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 706 days.

(21) Appl. No.: 13/198,387

(22) Filed: Aug. 4, 2011

(65) Prior Publication Data

US 2012/0143516 A1 Jun. 7, 2012

Related U.S. Application Data

(60) Provisional application No. 61/371,432, filed on Aug. 6, 2010.

(51) Int. Cl.
| | | |
|---|---|---|
| *G01N 31/00* | (2006.01) | |
| *G05B 15/02* | (2006.01) | |
| *F24F 11/00* | (2006.01) | |
| *G06F 17/50* | (2006.01) | |

(52) U.S. Cl.
CPC ......... *G05B 15/02* (2013.01); *F24F 2011/0094* (2013.01); *G06F 17/5004* (2013.01)

(58) Field of Classification Search
CPC ............ F24F 2011/0094; G05B 15/02; G06F 17/5004
See application file for complete search history.

(56) References Cited

U.S. PATENT DOCUMENTS 7,881,880 B2 * 2/2011 Rajamani et al. ............... 702/34
2009/0138099 A1 5/2009 Veillette 2009/0195349 A1 8/2009 Frader-Thompson et al.
2009/0302994 A1 12/2009 Rhee et al.
2010/0070101 A1 3/2010 Benes et al.

FOREIGN PATENT DOCUMENTS

| CN | 101116232 | 1/2008 |
|---|---|---|
| CN | 201444247 | 4/2010 |

OTHER PUBLICATIONS

Banaszuk et al., "Spectral Balance: a Frequency Domain Framework for Analysis of Nonlinear Dynamical Systems", 43rd IEEE Conference on Decision and Control, Dec. 14-17, 2004.
Eisenhower et al., "Uncertainty and Sensitivity Decomposition of Building Energy Models", Journal of Building Performance Simulation, May 2012, pp. 171-184, vol. 5, No. 3.
Mezic, Igor, "Coupled Nonlinear Dynamical Systems: Asymptotic Behavior and Uncertainty Propagation", 43 IEEE Conference on Decision and Control, Dec. 14-17, 2004.

(Continued)

*Primary Examiner* — Elias Desta
(74) *Attorney, Agent, or Firm* — Gates & Cooper LLP

(57) ABSTRACT

Systems and methods are disclosed for analyzing building sensor information and decomposing the information therein to a more manageable and more useful form. Certain embodiments integrate energy-based and spectral-based analysis methods with parameter sampling and uncertainty/sensitivity analysis to achieve a more comprehensive perspective of building behavior. The results of this analysis may be presented to a user via a plurality of visualizations and/or used to automatically adjust certain building operations. In certain embodiments, advanced spectral techniques, including Koopman-based operations, are employed to discern features from the collected building sensor data.

25 Claims, 18 Drawing Sheets

(56) References Cited

OTHER PUBLICATIONS

Mezic, Igor, "Spectral Properties of Dynamical Systems, Model Reduction and Decompositions", Nonlinear Dynamics, 2005, pp. 309-325, vol. 41.

International Search Report dated Mar. 23, 2012 for PCT application No. PCT/US2011/046620 filed on Aug. 4, 2011.
Rowley et al., "Spectral analysis of nonlinear flows". Cambridge University Press (2009) pp. 1-13.
Chinese Office Action (with English translation) dated Nov. 2, 2014 for Chinese Patent Application No. 201180048538.4.

* cited by examiner

SYSTEMS AND METHODS FOR ANALYZING BUILDING OPERATIONS SENSOR DATA

CROSS-REFERENCE TO RELATED APPLICATIONS

This application claims the benefit under 35 U.S.C. Section 119(e) of commonly-assigned U.S. Provisional Patent Application Ser. No. 61/371,432, filed on Aug. 6, 2010, by Igor Mezic and Bryan A. Eisenhower, entitled "SYSTEMS AND METHOD FOR ENERGY EFFICIENT BUILDING DESIGN AND MANAGEMENT," which application is incorporated by reference herein.

STATEMENT REGARDING FEDERALLY SPONSORED RESEARCH OR DEVELOPMENT

This invention was made with Government support under Grant No. DE-AC02-05CH11231 awarded by the Department of Energy. The Government has certain rights in the invention.

TECHNICAL FIELD

The systems and methods disclosed herein relate generally to analyzing and decomposing building sensor information into a more manageable form to subsequently determine behavioral properties of a real or synthetic building.

BACKGROUND OF THE INVENTION

Office buildings consume 40% of the energy used in the United States, and 70% of the electricity used in the United States. Energy consumption, whether electrical, fossil fuel, or other energy usage, has become a topic of concern, not only for efficient use of resources but also for the global impact that energy consumption has taken on.

Since interest in efficient use of energy is high, technologies and tools that support the design of comfortable, clean, and efficient buildings have been in use for many years. However, the inherent time and length scales for such technologies and tools are generally relatively long (hours, days, large building spaces) and the performance expectations for these tools are averaged over time and large spatial domains.

For example, occupants of a building are rarely interested in the fine details of the temperature in a room as long as the temperature is kept within prescribed boundaries, while owners of the building are merely interested in keeping their overall monthly energy costs to a minimum. However, this situation changes dramatically when recent increases in energy costs and concerns about environmental impacts are taken into account.

Many existing efficiency-improving methods seek to achieve global building efficiency by optimizing individual building energy system components or subsystems. For example, more efficient compressors are used as retrofits for air conditioning systems, timed thermostats are used to anticipate building occupancy, or systems are given priority rates from utility companies if the utility company can shut down or minimize energy deliveries in the event of a surge in energy requirements in the area. Such approaches do not take a systems approach to building management or design, which would allow for even larger savings than retrofitting and variable usage conditions currently in use. Accordingly, there is a need for a more comprehensive building energy analysis system.

SUMMARY OF THE DISCLOSURE

Systems and methods are disclosed for analyzing building sensor information and decomposing the information therein to a more manageable and more useful form. Certain embodiments integrate energy-based and spectral-based analysis methods with parameter sampling and uncertainty/sensitivity analysis to achieve a more comprehensive perspective of building behavior. The results of this analysis may be presented to a user via a plurality of visualizations and/or used to automatically adjust certain building operations. In certain embodiments, advanced spectral techniques, including Koopman-based operations, are employed to discern features from the collected building sensor data.

DETAILED DESCRIPTION OF SPECIFIC EMBODIMENTS

Modern buildings may include a variety of sensors to monitor the building's environment and energy usage. Despite the plethora of information these sensors provide, organizing this vast amount of data in a coherent manner can be a daunting task. Computer simulations of existing buildings or buildings yet to be constructed may similarly include a vast amount of data, the useful information of which is difficult to extract. Where these simulations incorporate data from both real-world and computer-simulated building sensors it may be especially difficult to extract meaningful information from the sensor results.

Certain of the present embodiments contemplate a sensor data analysis suite, comprising a plurality of data analysis tools, which facilitate efficient determination of relevant features in building sensor data. Particularly, the present embodiments improve the time, computational power, and reduce the level of user involvement necessary to determine factors affecting energy efficiency. Certain embodiments of this global building energy management system make analysis of all parameters and outputs of the building in question feasible, offering a building-wide optimization result, where even only a general understanding of the building's behavior may previously have been impossible.

Figure 1:
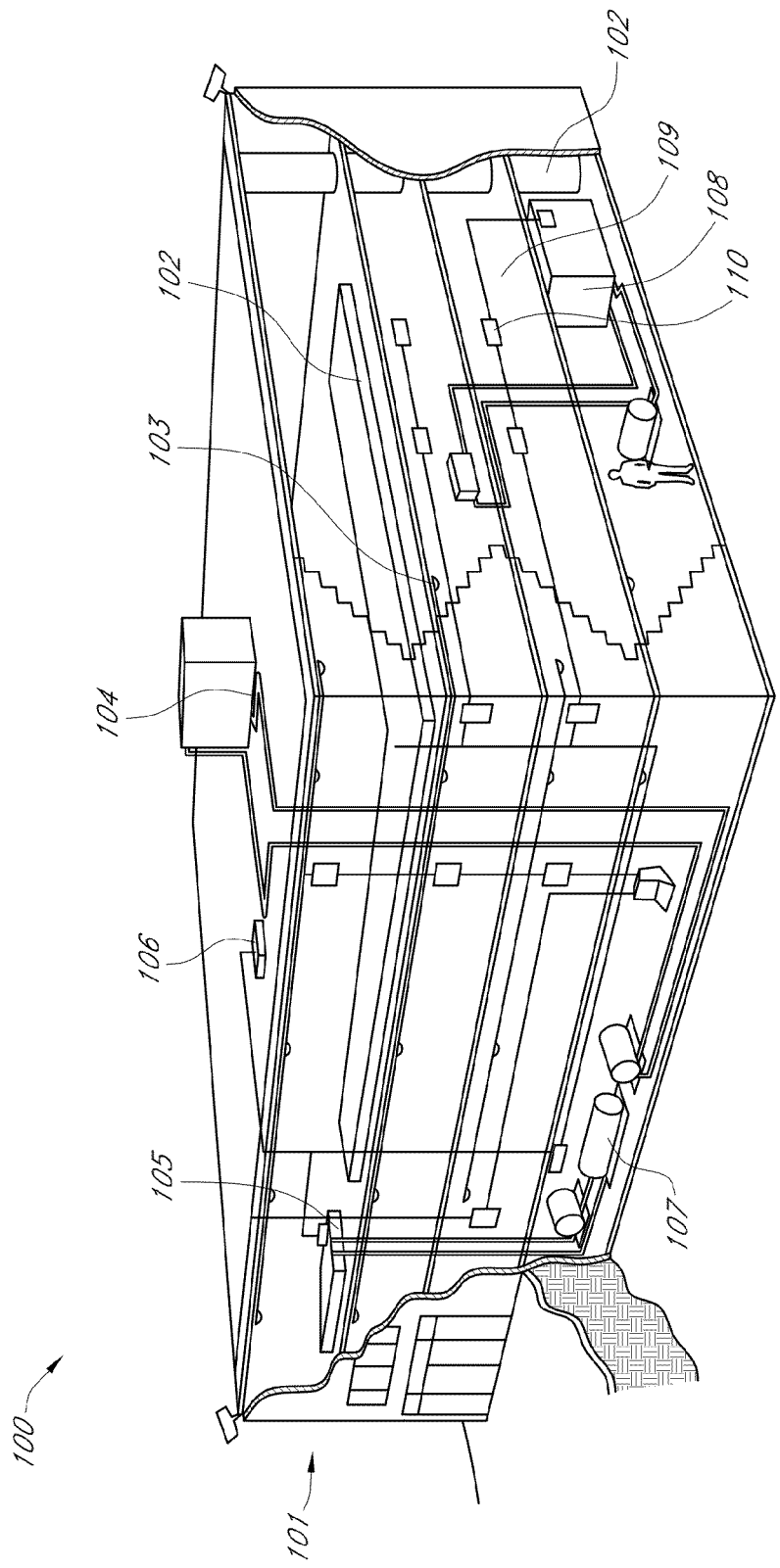
FIG. 1 illustrates a cutaway perspective of a building comprising a plurality of environment affecting components and building sensors.

FIG. 1 illustrates a cutaway perspective 100 of a building 101 comprising a plurality of environment and energy affecting components, as well as various building sensors configured to monitor the building's behavior. Particularly, the building may comprise electric, gas, and heating components 102, cooling towers 104, lighting 103, water systems 109 and other utilities. Some components such as the cooling coils 105, fans 106, and chillers and boilers 107, may be operated to adjust the internal temperature of various rooms of the building 101. Sensors, such as thermostats and humidistats, may be present and operate locally within the building. Some sensors may transmit their data to and be activated from a central office or control system.

Figure 2:
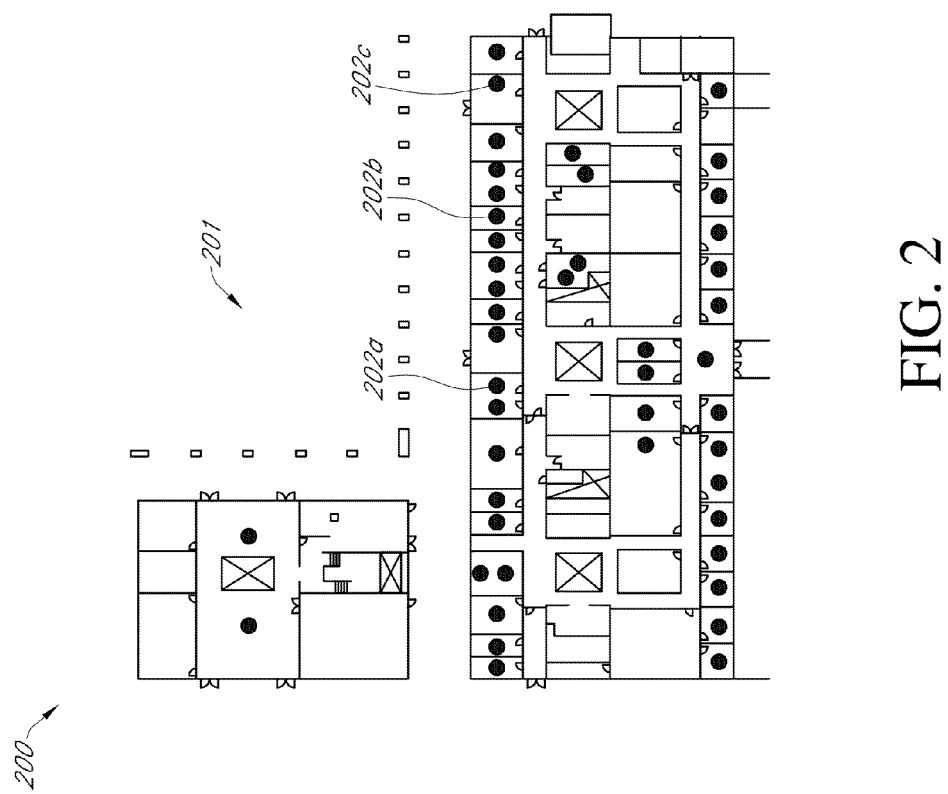
FIG. 2 is a floorplan for a building comprising a plurality of building sensors.

FIG. 2 illustrates a floorplan 201 of a building such as building 101. Although shown here as a two-dimensional, top-down view of a single floor, one will recognize a plurality of other possible representations, including a three-dimensional depiction of a multi-story architecture. Illustrated on the floorplan 201 are the locations of a number of sensors 202a-c. Each of these sensors may measure a plurality of properties of the building at their particular location, referred to herein as a "physical field". A "physical field" may comprise an environmental aspect, such as temperature or humidity, but may also comprise a system aspect such as power consumption or electrical flow. The physical field sensor readings may be converted to an appropriate form to facilitate analysis. For example, a sensor may record change in temperature, or change in humidity, or may instead record an integral of these values over a period of time. Alternatively a computer system can perform this post-processing on the raw sensor data. Sensors may, for example, measure physical fields such as temperature, humidity, air flow, electric power, occupancy, light, smoke, and/or any other sensors, individually or used in combination. Each sensor may store information locally, but may also transmit the information to a central system. Those sensors which communicate their information may be wireless or wired. Certain embodiments contemplate the sensors comprising an ad hoc infrastructure facilitating the transmission of readings to a central system. In certain embodiments comprising wireless sensors, routers may be used to collect data from local sensors and pass them on to the central system.

The floorplan 201 and sensors 202a-c may not reflect a physical, real-world, building and sensor layout, but may instead reflect a synthetic model of a building, such as a software model. Such a model may comprise a building to be constructed, or one which is already built. In a synthetic floorplan each sensor may be simulated by extracting simulation values from the model over different simulation cycles. In some systems a combined, physical and synthetic system may be used. For example, in FIG. 2, real-world physical data may be taken from real-world sensors 202a and 202b. However, sensor 202c may not exist in the real world and may be substituted with a synthetic software sensor. Similarly, sensors 202a-c may all physically exist, but may acquire different data or data via different standards. A software simulation can then be used to supplement the data between the sensors to achieve uniform sensor readings.

Once the data has been acquired from sensors 202a-c, it would be desirable to infer aspects of the building's behavior based on the measured physical fields. While a user, such as an architect or building operator, could analyze the data directly it may be very difficult to discern important behaviors without performing data processing. A data processing system may comprise a computing device having a processor and a memory. This system may be in the form of a personal computer or a cluster computer, and may involve computing devices in the computing cloud, or may be implemented as an embedded system, or in other forms that contain the basic processing and memory units. Certain embodiments contemplate data processing software which may run on the data processing hardware. This software may comprise a spatial-spectral information module, a graph decomposition information module, and a sensitivity analysis module described in greater detail below. An operator using this software may be able to discern building behaviors that would otherwise remain hidden by the sensor data's complexity.

Figure 3:
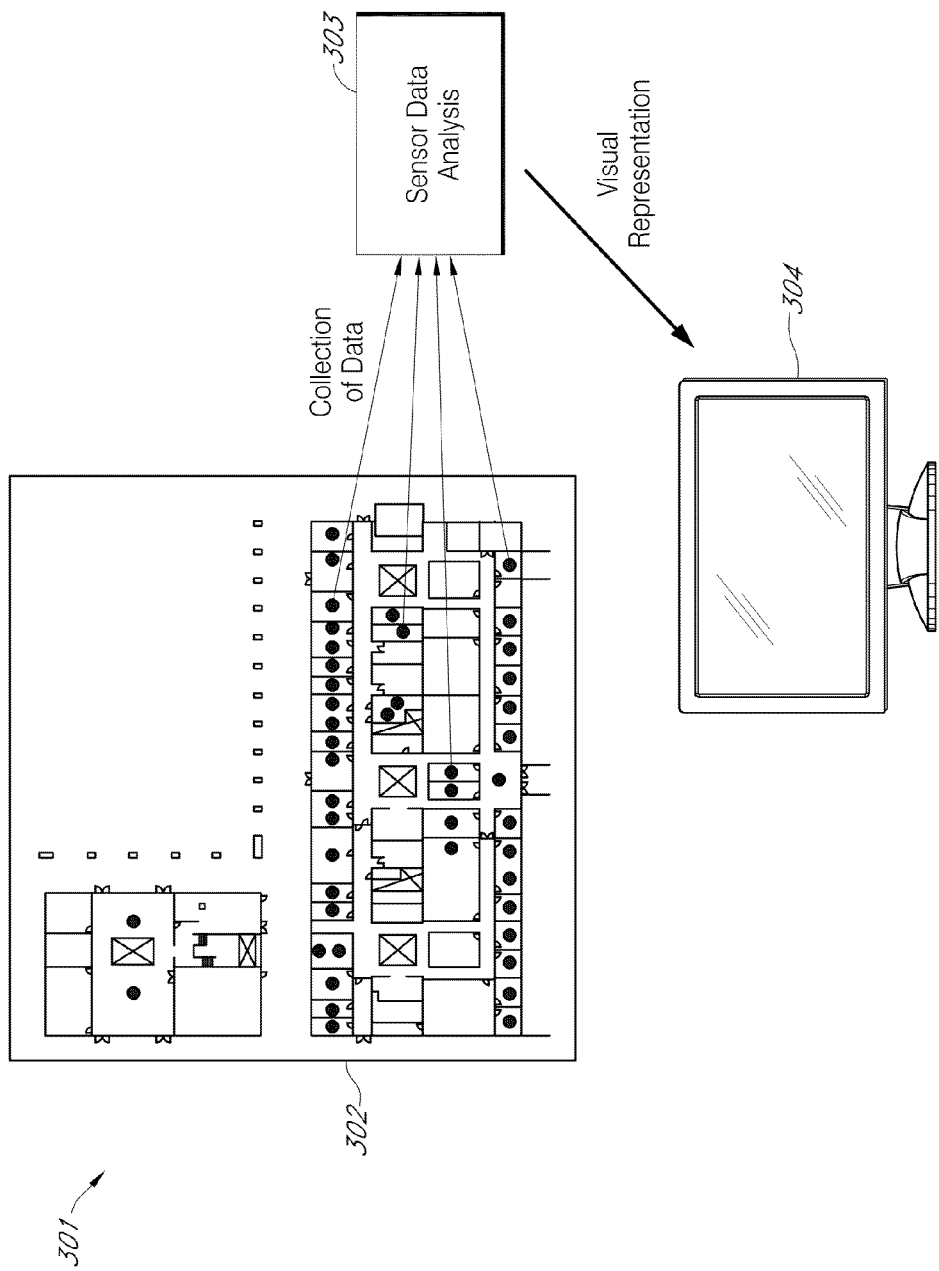
FIG. 3 is a generalized logical flow diagram illustrating how the building sensor data analysis of certain of the embodiments may be used for presenting a visualization of building sensor data analysis to a user.

FIG. 3 depicts a generalized logical flow diagram illustrating how the building sensor data analysis of certain of the embodiments may be used for presenting a visualization of a building sensor data analysis to a user. The system begins by acquiring sensor data 302, either physical or synthetically generated, from a building. The system then analyzes the sensor data 303. Analyzing the sensor data 303 may require transforming the data to a form more amenable to analysis as described in greater detail below (using orthogonal decomposition, frequency-based analysis, etc.). The system may then produce a visual representation 304 based on the analysis to provide a user with a clear conception of the building's behavior based on the one or more measured physical fields. A user reviewing this visual representation 304 may then manually adjust the building design or the building operation to achieve a more desirable building behavior.

Figure 4:
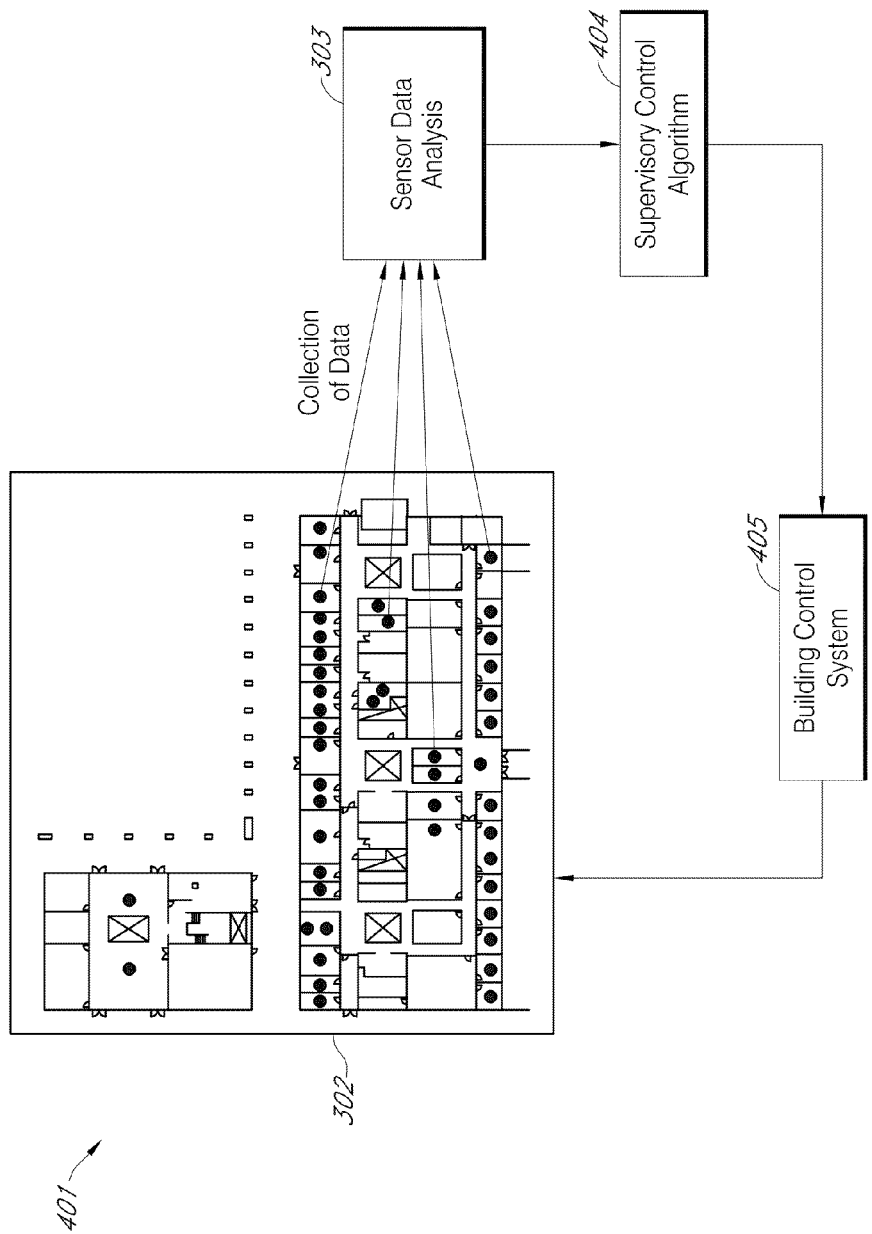
FIG. 4 is a generalized logical flow diagram illustrating how the building sensor data analysis of certain of the embodiments may be used in a building control feedback system.

FIG. 4 depicts another generalized logical flow diagram, this time illustrating how the building sensor data analysis of certain of the embodiments may be used in a feedback system. Here the analysis is used as part of a feedback process to automatically adjust the building's behavior. For example, when designing a building using synthetic sensors, the system of FIG. 4 may perform a simulation of the building's behavior, analyze the results 303, and then adjust the building configuration as part of a supervisory control process 404 to a more optimal design. This process may be performed iteratively until a desired stop condition is reached. In a real-world system, the process may instead adjust a building control system parameter using a building control system, which may comprise one or more actuators. For example, after analysis the system may establish a new activation pattern for the air conditioning in a particular room. Certain embodiments contemplate performing only either visualization (FIG. 3) or automated control (FIG. 4) while other embodiments contemplate performing both, possibly reusing the same data analysis 303.

Figure 5:
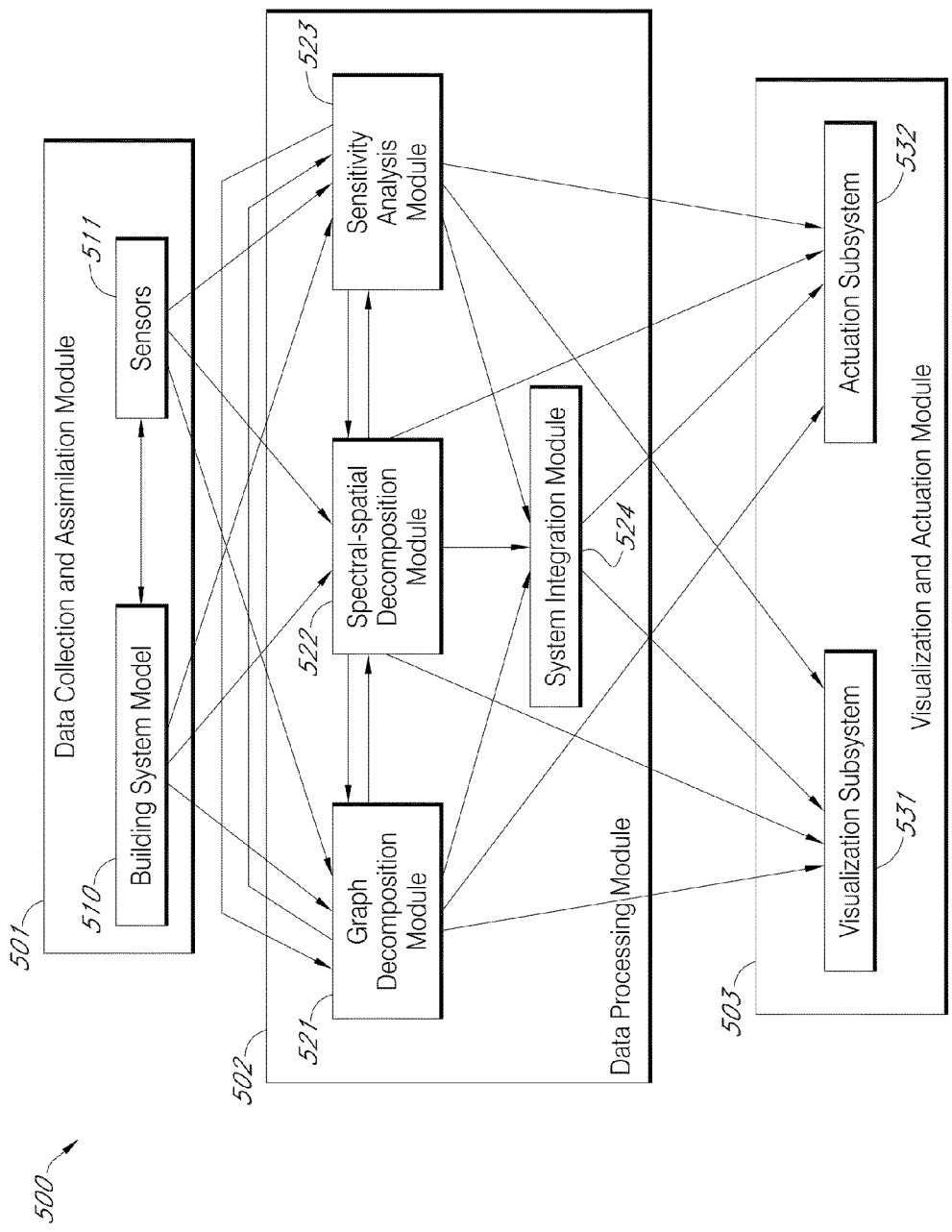
FIG. 5 is a systems diagram illustrating the modular arrangement of certain embodiments of the GloBEMS software.

Certain of the present embodiments contemplate a unified software suite which facilitates certain of the observations and operations depicted in FIGS. 3 and 4. FIG. 5 depicts one embodiment of this software system, referred to as a Global Building Energy Management System (GloBEMS). The energy, referred to may comprise thermal, electrical, or any other physical field data provided by the sensors which is pertinent to evaluating the building's behavior. Furthermore, some data considered by the system may be derived from sources other than sensors, such as calendar information, building meeting schedules, and weather information. The GloBEMS system may include methods and apparatuses for efficiently analyzing, visualizing and controlling building energy usage and for designing buildings that allow for more efficient energy usage. Such a system may be implemented in software, firmware, or hardware as described in greater detail below.

The diagrammatic representation of the software system of FIG. 5 may be generally divided into three modules. As discussed below, data collection may involve collecting data from real-world physical field sensors 511 or by using a synthetic building energy model 510, or by using a combination of the two. The sensor data and building energy model data can be integrated using data assimilation techniques that improve model information quality. The second module, the data processing module 502, may then transform the data acquired from the data collection module 501 into a form more amendable for analysis. The data processing module 502 may then analyze the data. The analyzed data may then be presented to a visualization and/or actuation module 503 which either visualizes the data 531 or actuates certain building systems 532 as described above with respect to FIGS. 3 and 4 respectively.

An effective visualization or system modification requires that the data be properly analyzed. Certain embodiments contemplate using one or more of a graph decomposition module 521, sensitivity analysis module 523, spectral-spatial decomposition module 522, including Koopman mode methods and energy-based (in some embodiments Proper Orthogonal Decomposition [POD]) methods, as described in greater detail below. The results of these modules may be provided to the visualization and actuation module 503 directly or may be first integrated via a system integration module 524. Particularly, information from graph decomposition 521, spectral-spatial methods, including Koopman mode methods and POD methods 522, or sensitivity analysis and uncertainty and sensitivity analysis module 523 can be integrated and refined using the system integration module 524. The information from the data processing module may be used by the visualization and/or actuation module to visualize the results of the data analysis or to take action based thereon, respectively.

Certain embodiments contemplate further interactions between the Graph Decomposition Module 521, the Spectral-Spatial Decomposition Module 522, and the Sensitivity Analysis Module 523. Particularly, after the system or a user has performed an analysis using the Spectral-Spatial Decomposition Module 522, certain embodiments contemplate using the results to perform a sensitivity analysis using Sensitivity Analysis Module 523 or a graph decomposition using Graph Decomposition Module 521. In some embodiments, the system may iteratively perform a sensitivity analysis or graph decomposition by performing a spectral-spatial analysis across a plurality of parameter values. That is, where a physical building is being studied, a parameter such as window shade length in the afternoon, may be set to one of a plurality of values and the spectral-spatial analysis subsequently performed for each of the values A sensitivity analysis may then be performed on the resultant modes. A similar process may occur for simulated building data from a synthetic model. The system or user may also perform iterative analyses using Spectral-Spatial Decomposition Module 522 and Graph Decomposition Module 521 in a similar manner. As indicated in the figure, certain embodiments also contemplate the Sensitivity Analysis Module 523 performing an analysis by interacting with the Graph Decomposition Module 521 directly.

One will readily recognize that not all of these modules need be present in a single system and that certain implementations may omit or include additional modules than those shown. For example, the processing software modules can also include energy models, flow models or any other physical models that computes future states of physical variables in a building. The processing software can contain modules that interlink, combine and additionally process any of the information in software modules described hereto.

Certain embodiments contemplate integrating the system 500 with a user interface including a visualization device such as a computer terminal. Such a computer terminal could be located in public areas of the building such as a lobby, business portions of the building such as offices, stores, data centers and other or building operator offices. The actuation system could include at least one actuator capable of actuating physical change in a system, such as change in mass, energy or lighting state of the system or providing occupants or operators with information that enables them to impose a physical change in the building system, such as a visualization system that displays messages of importance for energy control in a building.

Sensor Data Analysis—Overview

Figure 6:
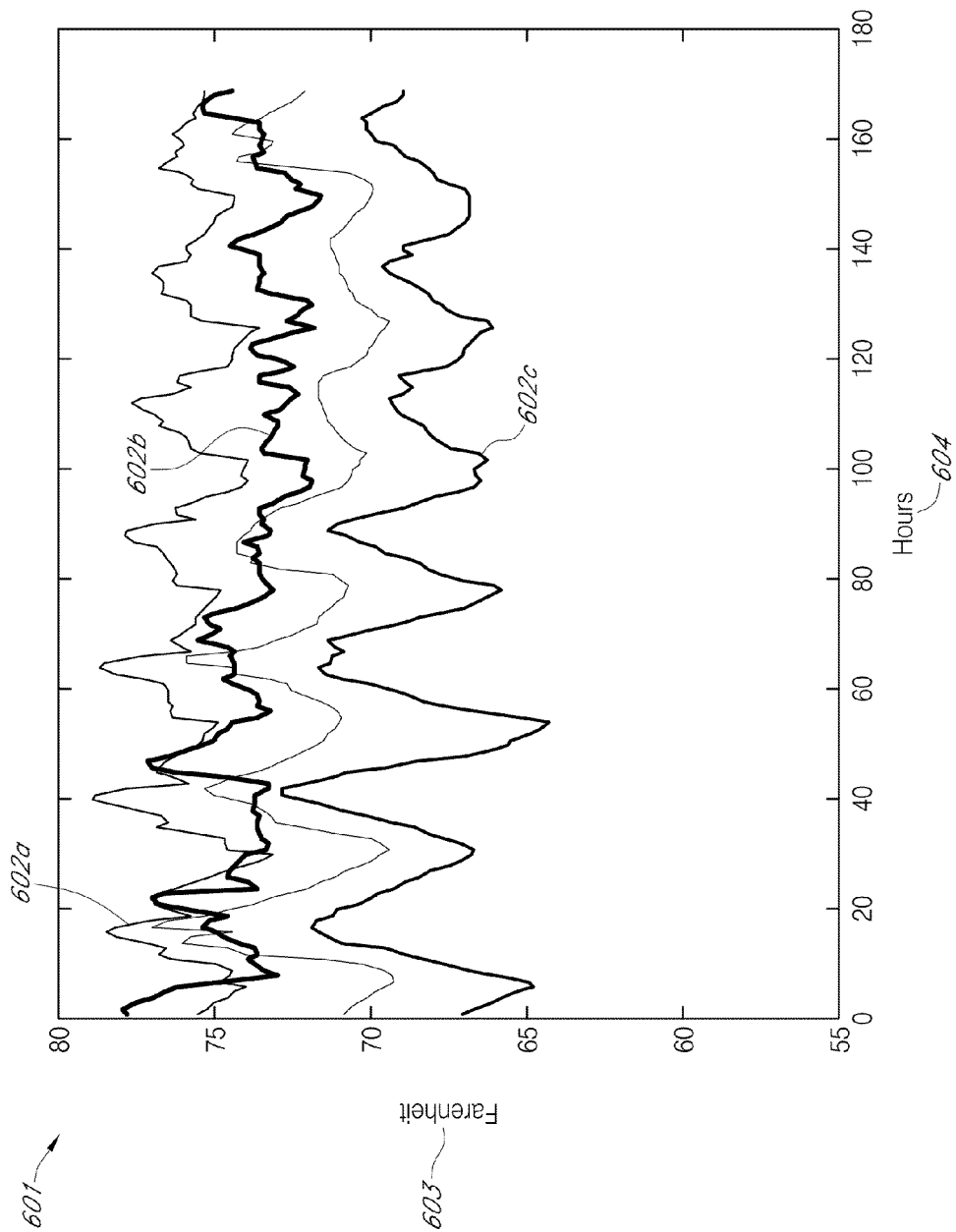
FIG. 6 is a time series plot of various building sensor data.

FIG. 6 illustrates an example dataset 601 for a plurality of sensors. For each sensor a data profile 602a-c may be generated depicting the sensor's value 603 over time 604. In this particular example, the sensors record temperature values at periodic intervals. One will recognize that the points may be interpolated between the sensor data to facilitate a continuous dataset if the sensors take samples at different periods or with relative phase offsets. Similarly, data may be interpolated for other reasons, such as when the sensors provide a sparse dataset. While it is possible for a user to analyze building behavior by visually inspecting raw sensor data as depicted 603, they are likely to overlook certain important features.

Figure 7:
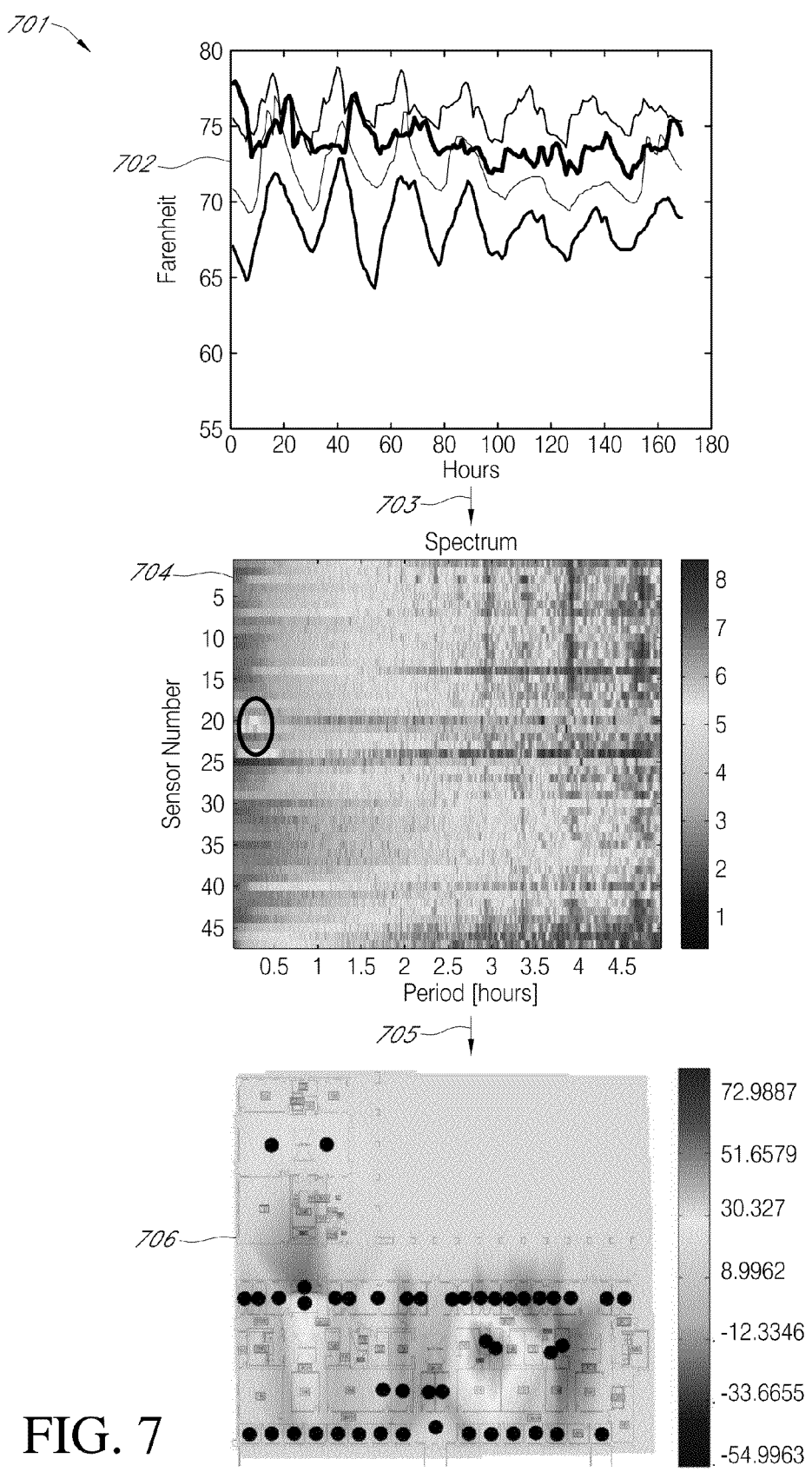
FIG. 7 is a generalized logical flow diagram illustrating how the building sensor data analysis of certain of the embodiments may be used to perform feature classification and data visualization.

FIG. 7 illustrates a general process by which sensor data may be converted to a form more amenable to analysis by a user or by an automated system. Initially, the raw sensor data 702 may be organized into a form for data manipulation. In some embodiments, records of individual sensor values over a time period of interest may be organized into a matrix and interpolation performed between values as necessary to achieve a complete dataset. This dataset may then be transformed 703 to a desired analysis form 704. In some embodiments this transformation 703 may comprise a Fourier Transform, Koopman, or other spectral-based technique. Generally speaking, methods such as the Fourier Transform and Arnoldi Method may be used when only a subset of the Koopman Operator's eigenvalues and eigenvectors are desired. Where a more complete set of eigenvalues and eigenvectors are desired, methods such as the Mezic method may be used. In some embodiments the transformation 703 may also comprise a POD (for example, Principal Component Analysis), or other energy-based analysis technique (one in the art will recognize the Mori-Zwanzig formalism, optimal prediction, and other projection methods).

The transformed dataset 704 may then be used to generate 705 a visualization 706 of the sensor data results, as described above with respect to FIG. 3. Generation 705 of the visualization 706 may occur in conjunction with a user-specified selection of a region of interest. In some embodiments, the visualization may comprise an overlay as depicted in FIG. 7. Rather than produce a visualization the system may instead analyze the modified data 704 and adjust control behavior as discussed above with respect to FIG. 4.

Sensor Data Analysis—Methods Overview

Figure 8:
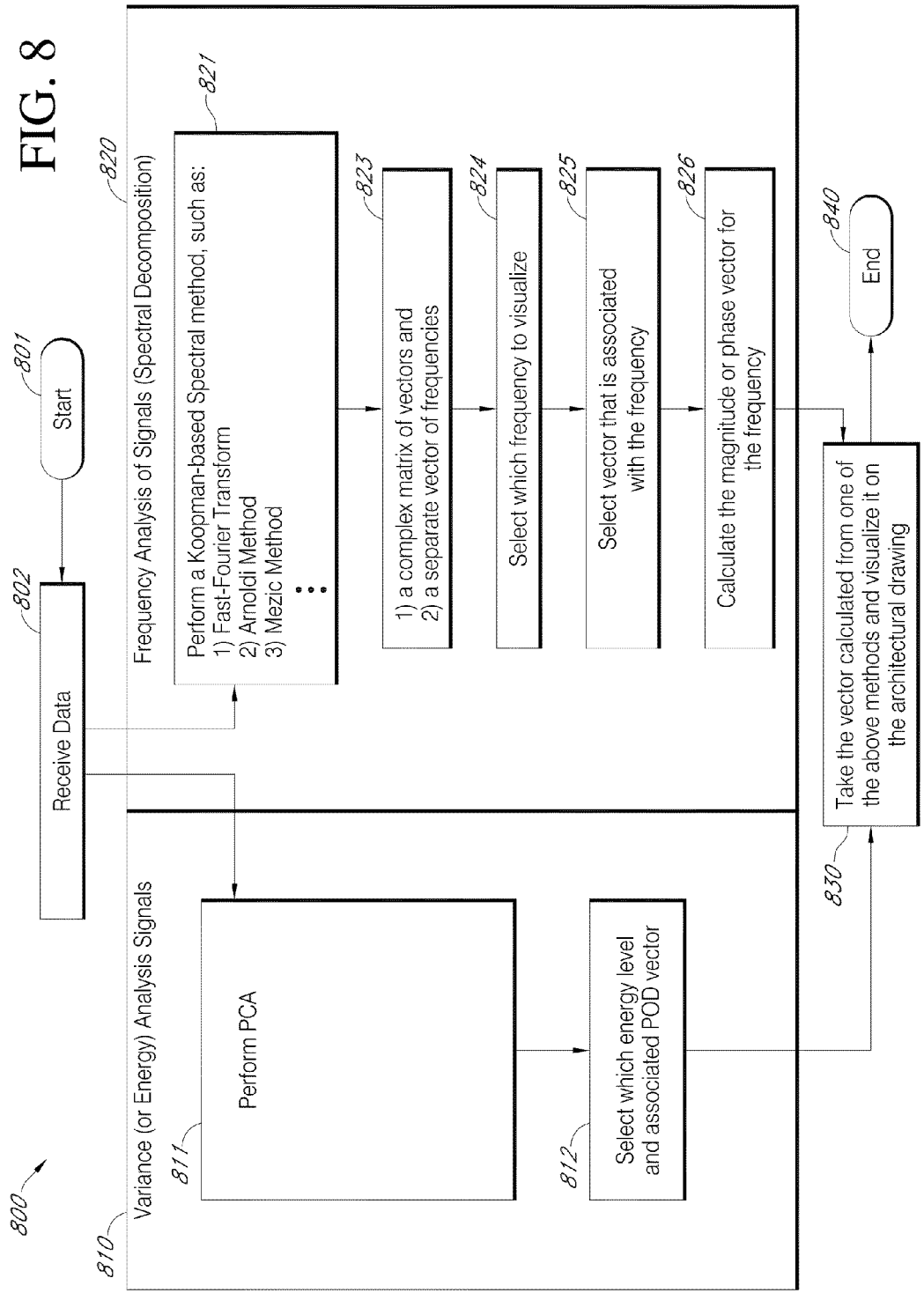
FIG. 8 is generalized flow diagram illustrating various of the data analysis and processing techniques implemented by certain of the embodiments.

Certain of the present embodiments provide a suite of data analysis techniques from which a user or control system may select. FIG. 8 depicts certain of the methods for generating data pursuant to the generally described process of FIG. 7. Particularly the embodiments illustrated by FIG. 8 comprise energy-based suite of methods 810 and a spectral based suite of methods 820. The energy based suite may comprise techniques, such as proper orthogonal decomposition (POD), (one will readily recognize various characterizations of POD in the art, such as Principal Component Analysis (PCA), Karhunen-Loeve transform (KLT), or the Hotelling transform). The frequency-based analyses may comprise the Fourier Transform and Koopman methods implemented using, perhaps, the Arnoldi or Mezic (harmonic averages of the spatial field) approaches discussed in greater detail below.

The system begins 801 by receiving the raw sensor data 802, possibly pre-processed and arranged into a suitable form. In some embodiments the received data may be organized as a matrix, wherein sensor values at a particular instant in time are placed in each column or row. As discussed above, interpolation between sensor values may be performed. Higher order matrices or tensors may likewise be used to organize more detailed datasets, although the following description is with respect to a two-dimensional matrix for purposes of illustration.

Certain embodiments contemplate performing a plurality of analyses using different methods from each of the suites 810, 820, etc. An energy based analysis, such as the POD analysis may be selected and performed (as generally described in greater detail below). POD will generate a plurality of vectors, comprising values associated with each sensor at a particular energy level. The user or the system may then select an energy level of interest 812. The vectors associated with the selected energy level may then be used to generate a visualization 830 similar to the overlay of FIG. 12 described in greater detail below at each of their respective sensors. As mentioned, the system may instead analyze the selected energy level to determine an appropriate action to take.

Sensor Data Transformation—Proper Orthogonal Decomposition

As mentioned, in certain embodiments the sensor data may be transformed via POD to a form more amenable for analysis. As POD comprises a plurality of decomposition techniques, the following description is merely a generalization of certain embodiments for descriptive purposes.

During POD, the system may first receive the physical field data from the real, simulated, or partially real and simulated building sensor data. In some embodiments, the mean of the data may then be subtracted and the covariance matrix of the modified dataset calculated. The eigenvalues and eigenvectors of this covariance matrix RR06 may then be calculated. Known techniques for the calculation or estimation of eigenvalues, such as matrix decomposition (Support Vector Decomposition) or the Jacobi eigenvalue algorithm may be used. The eigenvalue with the highest value may be termed the "principle component" and a total ordering of eigenvalues performed based upon their respective magnitudes. The eigenvectors corresponding to each eigenvalue may be similarly ordered based upon the eigenvalue magnitudes. Each of these eigenvectors may be referred to as a mode (the first mode being the "principle component", etc.). Depending on the system configuration, some number of the largest eigenvectors may be selected to form a "feature vector". The data is then projected onto this feature space to derive the POD features, or modes. The above is merely a general summary of the POD process and one skilled in the art will readily recognize numerous various and omitted details.

Thus, POD generates a plurality of real vectors (i.e., vectors comprising real components) and the associated energy values (eigenvalues, or singular values). These vectors, or modes, may then be used in order to visualize the spatial location of dominant dynamical energy of the sensor data. To clarify, the "dynamical energy" or "spectral energy" of the sensor data is here referring to the "energy" in the signal in a signal processing sense. This energy may or may not be correlated with, or the same as, the thermal, electrical, or other physical field energy in a building.

Figure 11:
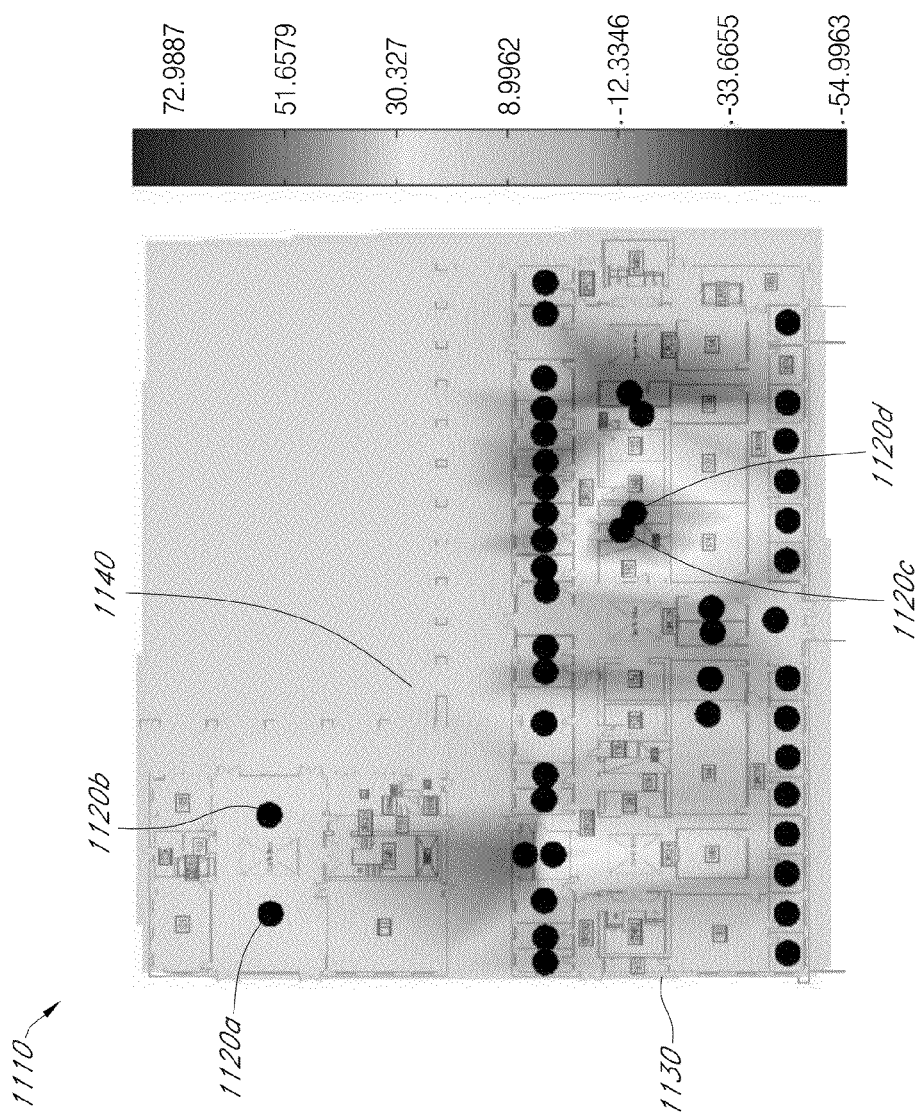
FIG. 11 is an illustration of an interpolated overlay upon a floorplan of the data selected for a frequency, or mode, from FIG. 10.

The system or user may then select an energy level and an associated eigenvector to perform a visualization similar in appearance to FIG. 11. Particularly, each value from the vector is plotted in the overlay at the spatial location of the corresponding sensor on the floor plan and may be scaled appropriately as necessary. Interpolation between values may then be performed to plot intermediate values between sensor locations on the overlay. This may make it easier to determine building behavioral properties and to distinguish faulty operation from non-faulty operation, specifically by identifying dynamical energy content in a Proper Orthogonal Mode that is neither typical (where typical behavior may be established based on the measurement of the operation of a building or by running an energy model) nor user-requested. Such information can also be used to design supervisory controllers. When faulty operation is identified at a spatial location using POD, actuators at that location may be instructed to perform corrective action.

Unfortunately, while POD is useful for determining some features of the data it may not always lend itself to a comprehensive understanding of the building behavior. Particularly, the largest eigenvalues of the above POD analysis indicate the highest energy modes of the transformed dataset. Organizing the data based on the highest mode may not always be useful. These energies may comprise many different frequencies of information that instead reflect anomalous behavior in the building operation. Furthermore, each eigenvector of the POD may be orthogonal to its peers. Thus, in some instances, it may be more preferable to view or take action based on the data after transforming the data to a form which facilitates more versatile reflection of the data contents, particularly including the frequency content. In certain embodiments, a spectral transformation, such as a Fourier or more generalized Koopman-based analysis, provides this versatility.

Sensor Data Transformation—Spectral-Based Approach—
Fourier Transform

The spectra and modal content of the data may reveal useful information about the content of the data especially when its origin is from building sensors. Sensor faults, improperly installed or commissioned control systems, and aging or dysfunctional equipment may be detected. Although Koopman and Fourier methods are discussed separately in this document, one will readily recognize that the Fourier method comprises a specific instance of the more general Koopman-based methods referred to herein.

Spectral analysis is also useful for the calibration of building models. Spectral analysis provides a quick way to determine the performance of a building and may therefore be used as a metric to determine the difference in the performance of a model as compared to the performance as seen in real-world data. Spectral analysis may be used to re-calibrate building systems models by comparing spectral modes of model versus the data. If, for example, the phase response from the model differs from what was seen in data, the model may be re-calibrated.

In certain embodiments, the Fast Fourier Transform (FFT) may be employed to determine the frequency character of the sensor data. In these embodiments, the system may iterate through each sensor in the dataset 821 and calculate the FFT for the sensor values over a selected period. One will readily recognize alternative methods for calculating the Fourier Transform, such as by performing a multi-dimensional FFT of the data. In either case, the Fourier Transform in certain embodiments will produce a "mode" matrix comprising complex-valued entries (representing the corresponding phase and magnitude). In these embodiments, a first dimension of the matrix may correspond to each of the sensor values (M rows in the matrix for M sensors). A second dimension of the matrix may correspond to a vector of frequencies also produced by the Fourier Transform (N columns of the matrix for N frequencies). Thus, for a matrix comprising M rows and N columns (an M×N matrix), the matrix entries will represent the value of the Mth sensor associated with the Nth frequency. Again, each of these entries will be complex to represent the phase and magnitude. In such an arrangement, each of the N columns may be referred to as a "mode".

Also, each of the M rows may be separated from the matrix to produce a "frequency vector" for a sensor. The modes may similarly be separated from the matrix. Thus, each column of the matrix will comprise the mode related to the $i^{th}$ frequency in the frequency vector. One will realize that this arrangement is merely for the purposes of illustration and that the same data can be organized differently.

Once the Fourier representation is acquired, the user or system may then select a frequency, or mode, of interest 824 (a column N of the matrix) and determine the corresponding vector or frequency values 825 (each of the M sensor entries for that column). The system can then determine the magnitude and phase for each sensor 826 based on the complex entries of the selected matrix row. This will generate a pair of values which may be associated with each sensor. The system may generate a first plot 830 for the magnitude and a second plot 830 for the phase. A discussion of the magnitude plot is made with reference to FIG. 11 and of the phase plot with reference to FIG. 12. As previously discussed the system may instead take action on the analysis.

Figure 9:
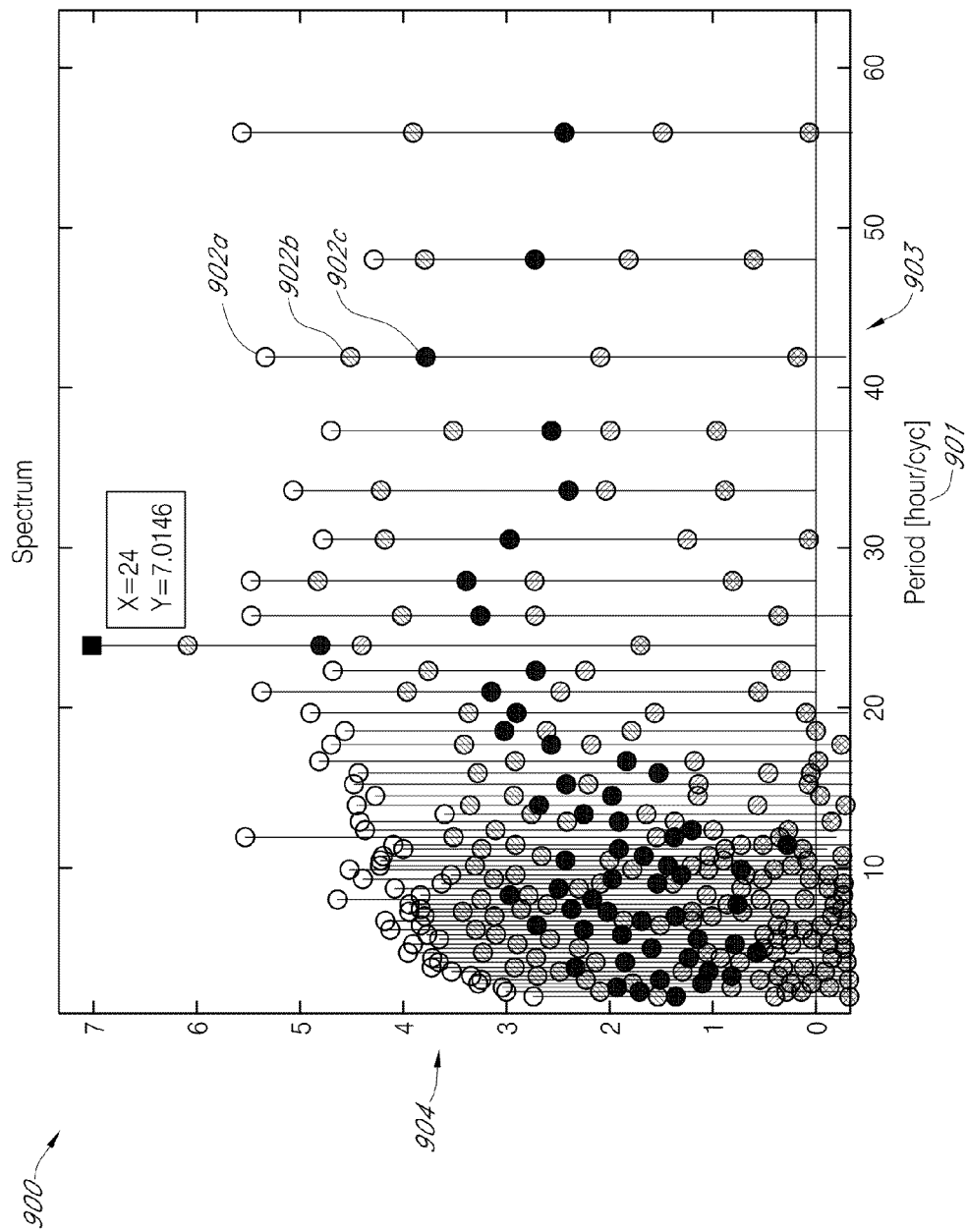
FIG. 9 is a plot of the frequency, or more generally, the Koopman spectrum for a particular set of sensor data using a first visualization technique.

FIG. 9 depicts one possible visualization 900 of the sensor dataset's spectral character, as determined by a method such as the Fourier Transform. Here, the period 901, rather than the frequency has been used to organize each sensor value. The magnitude of a value is depicted by the vertical axis 904. Each circle 902a-c represents a sensor value corresponding to a particular period/frequency, in this case 42 hours/cycle 903. While the representation 900 of FIG. 9 is accurate, it may be difficult for a human operator or automated system to ascertain the building's behavior from such a visualization.

Figure 10:
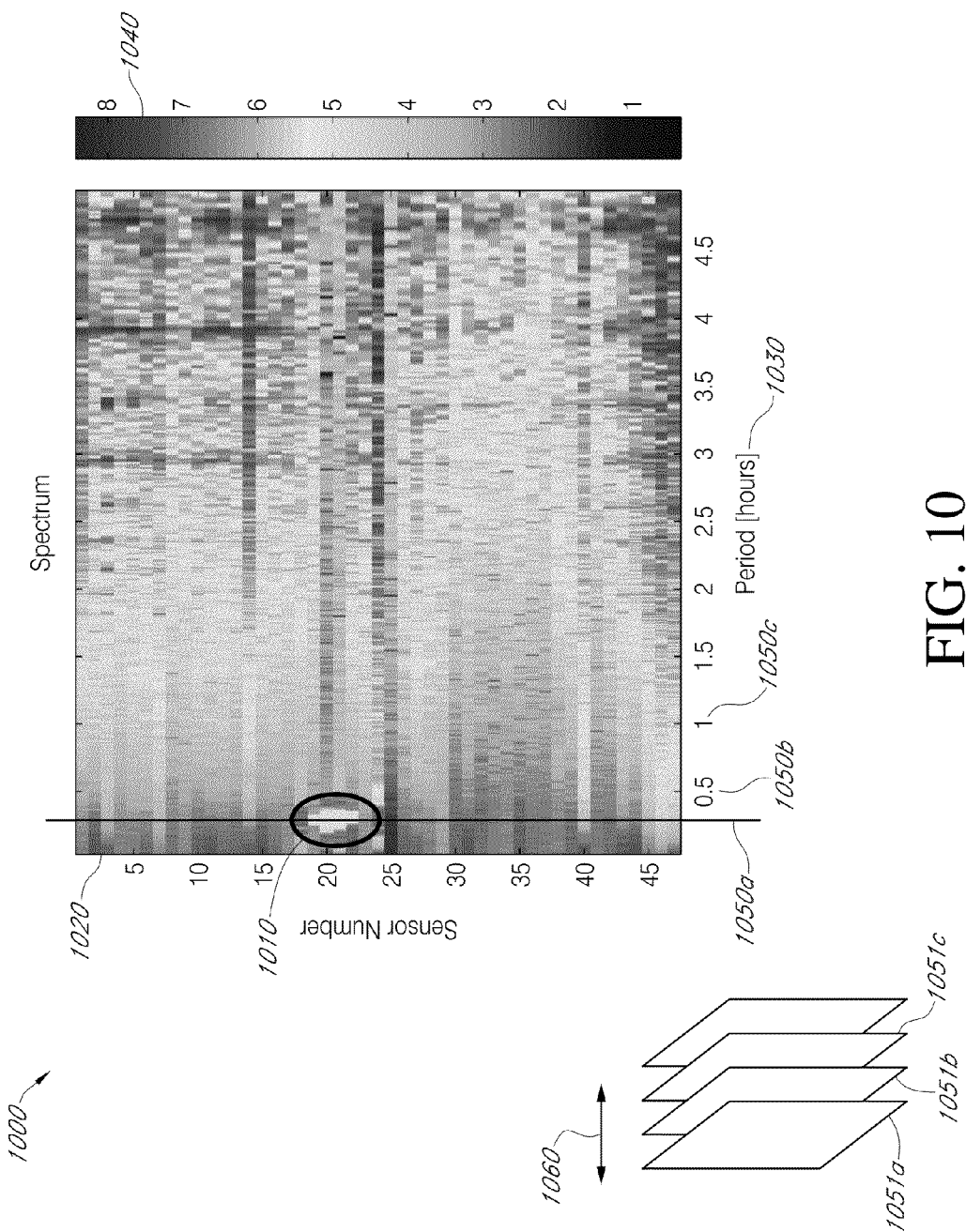
FIG. 10 comprises a plot of the frequency, or more generally, the Koopman spectrum for a particular set of sensor data using a second visualization technique facilitating selection of data at individual frequencies from an arrangement of values.

FIG. 10 depicts another possible visualization of a dataset's spectral character, determined using, for example, the Fourier Transform or a Koopman-based approach. Here the sensor values are organized along the vertical axis, corresponding to the M rows of the generated matrix. The frequency/period is indicated along the horizontal axis, corresponding to the N columns of the generated matrix. Generally, the frequency resolution may be restricted by the available data. However, algorithms, such as FFT, may provide parameters to specify the frequency grid for which calculations are to be performed. Additional methods for interpolating between available datapoints will also be readily known to one in the art. For each entry 1010, the corresponding magnitude for a sensor value is depicted by the intensity. In some embodiments, the intensity may be reflected in the hue or luminosity of the entry or by a height if the visualization were presented in a 3D view. This three dimensional representation (sensors, period, and magnitude) facilitates user selection of the values associated with the sensors at a particular frequency. For example, in certain software implementations, a user may move a slider along the frequencies 1050A-C in a range 1060 and generate a corresponding visualization 1051A-C for all the sensors at each of the selected frequencies 1050A-C. By inspection of the visualization 1020, a user can identify anomalous spectral behavior, such as that indicated at the entry 1010. The user may select the corresponding frequency 1050A and generate the corresponding visualization 1051A.

One such visualization 1110 is depicted in FIG. 11. Having selected the desired frequency, the system may iterate between each sensor value of the corresponding vector. These values may be assigned to each sensor 1120A-D in an overlay on the building floorplan. Although illustrated here as a two-dimensional floor plan, one will recognize that a three-dimensional representation may also be provided. The system may then generate values between each of the sensors' 1120A-D values, such as at pixel location 1140, by interpolating or averaging nearby sensors. In this example, the values corresponding to sensors 1120C and 1120D are quite high, whereas the neighboring values are much lower. This may indicate an anomalous behavioral property, if the physical field at these sensors' location is not intended to be active at the selected frequency. One will recognize the identified behavioral property as being any property correlated with a physical field of the building, such as temperature fluctuation, energy-usage fluctuation, electrical-activity fluctuation, etc. Determining such a behavioral property may involve an automated system recognizing the behavioral property from the above-processed data, or the property being presented to the user as part of a visualization. In some embodiments, the sensor influence may be weighted by the distance from the pixel location 1140 to the sensors. One will readily recognize that a similar interpolated-overlay may be generated for any sensor-based collection of values, such as the results of the POD analysis. Any physical field may be plotted in this manner. For example, temperature, humidity, airflow, pressure, people occupancy, plug load density, light intensity, etc. may all be overlaid on the floor plan of the building.

Figure 12:
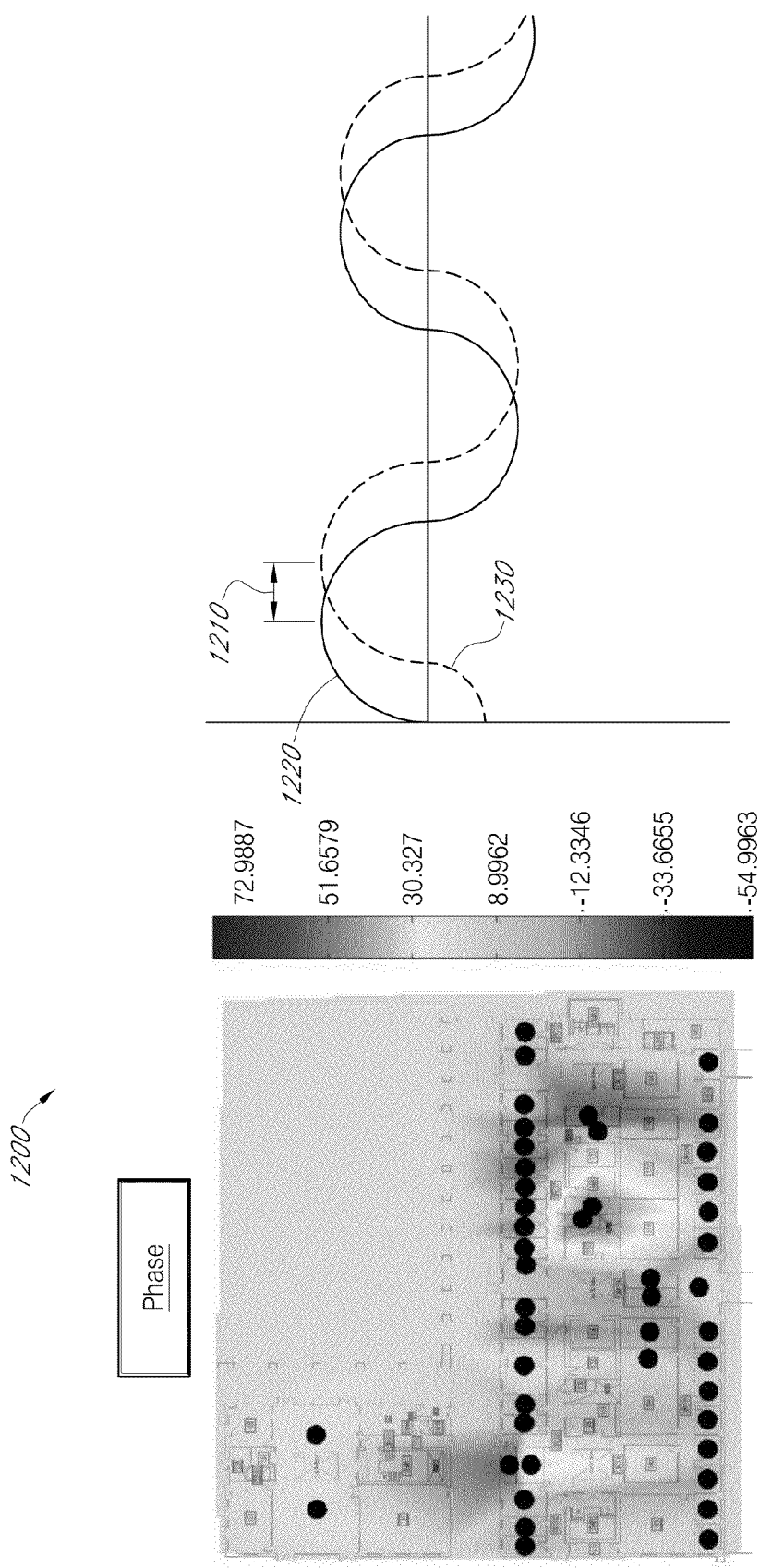
FIG. 12 depicts an interpolated overlay of the sensor data on a floorplan at a particular phase selected from the arrangement of FIG. 10.

As mentioned, each complex entry of the matrix will facilitate both magnitude and phase information for the sensor. For these spectral-based techniques, a similar visualization to 1110 may be generated for the phase information of the sensor. FIG. 12 depicts a phase visualization again overlaid over a floorplan 1200. Here, each value associated with a sensor indicates the phase difference between the sensor's data and a reference frequency at the selected frequency 1050A. Certain spectral techniques, such as the Fourier Transform, generally generate the phase with respect to a reference of zero, or no phase. In some embodiments, the phase of the sensor data 1230 is instead calibrated relative to the frequency of the ambient outdoor air temperature 1220. That is, if the sensor data has a phase relative to zero phase of 30 cycles, and the outdoor air temperature has a phase relative to zero of 20 cycles, the sensor phase value used for generating visualization 1200 may be 10 cycles. The user or system may select alternative references than the ambient air temperature, such as a phase associated with the operational hours of the building. In this manner the visualization 1200 will depict the sensor relation to a basis of interest.

While the Fourier Analysis provides important information regarding the spectral character of the building sensor data, the system or user is constrained to analyzing the spectral character according to the principles inherent to the transform.

The system or user may be better able to identify anomalous building behavior or regions of interest if they had greater flexibility and control over the character of the generated spectral content. Certain embodiments contemplate applying more sophisticated techniques, such as Koopman-based spectral techniques, than the Fourier Transform. Generally, Koopman analysis provides a less restrictive collection of tools for assessing the spectral character of a set of sensor data. In some embodiments the Koopman character of the data is determined by applying the Arnoldi, Mezic, or similar methods.

Sensor Data Transformation—Spectral-Based Approach—Koopman-Operator Based Spectral Methods The Koopman operator is an infinite-dimensional linear operator associated with a full nonlinear system. Particularly, consider a dynamical system evolving on a Manifold M, such that, for $x_k < M$, $$x_{k+1} = f(x_k) \quad (1)$$

where f is a map from M to itself, and k is an integer index. As an example, the manifold M may comprise the entire universe of possible sensor values for a collection of sensors. The system as a whole may possess state $x_k$ at time k and subsequently $x_{k+1}$ at time k+1. The map, or function f, is then indicative of the means by which the system transitions from each successive state, i.e. between each set of sensor values. The Koopman operator is a linear Operator U that acts on scalar-valued functions on M in the following manner: for any scalar-valued function g: M→R, U maps g into a new function Ug give by $$Ug(x) = g(f(x)) \quad (2)$$

By virtue of the operator's ability to relate these functions in this manner, the operator possesses important information about the nature of the function f. Were the operator determined for the function associated with a building, it would yield important information regarding the qualities of that building. Unfortunately, although the dynamic system is nonlinear and evolved on a finite-dimensional manifold M, the Koopman operator U itself is infinite dimensional. Thus, computing the Koopman Operator itself, exactly, is generally intractable. Furthermore, building systems usually comprise large sets of sensor data $x_k$, $x_{k+1}$, $x_{k+2}$, etc. and the function f describing this relationship is usually extremely complex and unknown.

Thus, it would be desirable to analyze the system information contained in the Koopman Operator, but using only available data-collected either numerically or experimentally and without having to calculate the Operator explicitly. Certain of the present embodiments contemplate instead calculating the eigenfunctions and eigenvalues of the Koopman Operator U and using these as a basis for analysis of the system. Furthermore, these embodiments employ methods for deriving the eigenfunctions and eigenvalues from only a finite, known set of data. Let $\phi_j$ denote the eigenvectors or eigenfunctions of the Koopman Operator (referred to herein as Koopman eigenfunctions) and letting $\lambda_j$ denote the eigenvalues (referred to herein as the Koopman eigenvalues), then:

$$U\phi_j(x) = \lambda_j \phi_j(x), j = 1, 2, 3 \ldots \quad (3)$$

The known dataset may then be characterized as a vector-valued observable q: M→Rp. That is, a collection of values from the universe of possible values. The observable q may be projected upon the Koopman eigenvectors to retrieve the desired spectral information. The dataset may then be represented in terms of its components relative to the Koopman Eigenspace, i.e. as:

$$q(x) = \sum_{j=1}^{\infty} \varphi_j(x) v_j \quad (4)$$

Where $v_j$ are a linear combination of vectors representing the component of q(x) along that component of the Koopman eigenvector, or sometimes referred to as an eigenfunction, $\phi_j$. Some embodiments refer to these vectors as "Koopman modes" of the data. Thus, the Koopman eigenvalues $\lambda_j$ characterize the temporal behavior of the corresponding Koopman mode $v_j$. The phase of $\lambda_j$ determines the frequency, and the magnitude determines the growth rate. The Koopman eigenvalues characterize the temporal behavior of the corresponding Koopman mode. The Koopman modes may be plotted visually in a similar manner to the Fourier Transform as was discussed in relation to FIG. 11.

Calculation of the Koopman eigenvectors and eigenvalues may be accomplished by a variety of methods, including the Arnold algorithm, variations of the Jacobi method, and the Mezic method described in greater detail below. Qualities of the Koopman operator's spectra may be used to quickly highlight inconsistencies in controller function. As was discussed with regard to the Fourier Transform, investigating the Koopman modes generally comprises computing the spectra of the Koopman operator and then selecting a particular frequency of interest. The Koopman mode associated with the selected frequency may then be obtained and investigated. Koopman mode information further allows users to quickly quantify whether these very important parts of the building dynamics are properly set up in the model. This may facilitate the identification of differences between predictions and measurements and thus to highlight performance issues with the building. Insights based on the magnitude and phase information may also be used to improve a corresponding simulation model. Koopman-based methods are well suited for dynamics which contain significant amounts of periodic content. Koopman methods facilitate quick conclusions regarding sensor function and may also be used to compare models and real-world data more quickly. A complete description of the Koopman operator may be found in "Spectral Analysis of Nonlinear Flows" Rowley, et al., Journal of Fluid Mechanics (2009), 641: 115-127, incorporated by reference herein.

Figure 13:
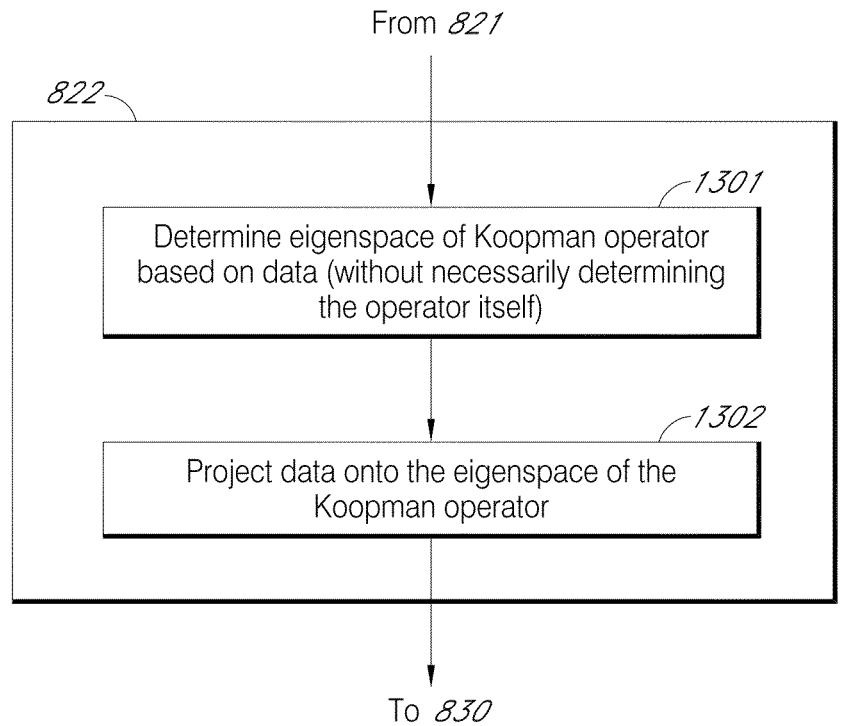
FIG. 13 depicts a generalized flow diagram for performing a Koopman-based analysis of the data.

FIG. 13 illustrates a generalized flow diagram for performing a Koopman-based analysis of the data. Koopman-Based operations 821 as found in certain implementations of the suite of spectral techniques 820. Generally, these Koopman-based operations will determine the eigenspace 1301 (the collection of eigenfunctions) of the Koopman Operator of the dataset based on one of a plurality of methods (discussed in greater detail below). The system may then project 1302 the original dataset onto this determined eigenspace, in some embodiments by taking the inner product. This will produce the spectral data from which a frequency of interest 824 and associated visualization may be produced. Although depicted in FIG. 13 as two separate steps, one will readily recognize that the computational implementation may perform these operations simultaneously or in effect via other operations.

Calculation of Koopman Modes—Arnoldi Method

The following disclosure presents one possible algorithm, the Arnoldi Method, for computing Koopman modes given only values of a particular observable (snapshots), sampled at regular times. Data from real-world sensors may regularly be in the form of these snapshots. We assume that for any state x, w may measure a vector-valued observable $g(x) \in R^p$. In particular, the Arnoldi algorithm, when applied to a nonlinear system, produces approximations to eigenvalues of the Koopman operator and their corresponding modes.

The following discussion provides an example version of the Arnoldi algorithm which operates on a linear system and does not require explicit knowledge of the underlying operator A. However, certain embodiments contemplate an alternative interpretation of the algorithm that applies to nonlinear systems, and connects with the Koopman modes. Applications of the Arnoldi method in a nonlinear context are also discussed in "Spectral Analysis of Nonlinear flows" Rowley, et al., Journal of Fluid Mechanics (2009), 641: 115-127, incorporated by reference above.

Example Arnoldi Algorithm for Linear Systems

The following is a general discussion of certain aspects of the Arnoldi algorithm as may be applied in certain of the embodiments. Consider a linear dynamical system $$x_{k+1} = A x_k \quad (5)$$

where $x_k \in R^n$, and n is so large that we cannot compute eigenvalues of A directly. Certain embodiments compute estimates of these eigenvalues using the Krylov method, in which one starts with an initial vector $x_0$ (often chosen to be a random vector), and computes iterates of $x_0$. After m−1 iterations, one has a collection of m vectors that span a Krylov subspace, given by span $\{x_0, Ax_0, \ldots, A^{m-1}x_0\}$. Certain embodiments then approximate eigenvalues and eigenvectors by projecting A onto this m-dimensional subspace, and computing eigenvectors and eigenvalues of the resulting low-rank operator. The data vectors may be stacked into an n×m matrix $$K = [x_0 \; Ax_0 \; A^2 x_0 \; \ldots \; A^{m-1} x_0] \quad (6)$$
$$= [x_0 \; x_1 \; x_2 \; \ldots \; x_{m-1}]$$

then we wish to find approximate eigenvectors of A as linear combinations of the columns of K. The Arnoldi algorithm is a type of Krylov method in which one orthonormalizes the iterates at each step, and it therefore involves computing the action of A on arbitrary vectors. A variant of this algorithm that does not require explicit knowledge of A is given below.

First, consider the special case where the m-th iterate xm is a linear combination of the previous iterates. We may write $$x_m = A x_{m-1} = c_0 x_0 + \ldots + c_{m-1} x_{m-1} Kc \quad (7)$$

where $c = (c_0, \ldots, c_{m-1})$. Thus, we have $$AK = KC \quad (8)$$

where C is a companion matrix given by $$C = \begin{pmatrix} 0 & 0 & \ldots & 0 & c_0 \\ 1 & 0 & & 0 & c_1 \\ 0 & & & & c_1 \\ \vdots & & \ddots & & \vdots \\ 0 & 0 & \ldots & 1 & c_{m-1} \end{pmatrix} \quad (9)$$

The eigenvalues of C are then a subset of the eigenvalues of A: if $$Ca = \lambda a \quad (10)$$

then using (8), one may verify that v=Ka is an eigenvector of A, with eigenvalue λ.

More generally, if the m-th iterate is not a linear combination of the previous iterates, then instead of the equality (7), we have a residual $$r = x_m - Kc \quad (11)$$

which is minimized when c is chosen such that r is orthogonal to span $\{x_0, \ldots, x_{m-1}\}$. In this case, the relation (3.5) becomes $AK = KC + re^T$, where $e = (0, \ldots, 1) \in R^m$. The eigenvalues of C are then approximations to the eigenvalues of A, called Ritz values, and the corresponding approximate eigenvectors are given by v=Ka, called Ritz vectors. Note that the full Arnoldi method is more numerically stable than this method, and reduces A to an upper Hessenberg matrix, rather than a companion matrix.

As mentioned with regard to FIG. 13, an important feature of the above algorithm is that it does not require explicit knowledge of the matrix A: all it requires is a sequence of vectors, as summarized below.

Consider a sequence $\{x_0, \ldots, x_m\}$ where $x_j \subset R^n$. Define the empirical Ritz values $\lambda_j$ and empirical Ritz vectors $v_j$ of this sequence by the following algorithm:

Define K by (3.3) and find constants $c_j$ such that $$r = x_m - \sum_{j=0}^{m-1} c_j x_j = x_m - Kc, \quad (12)$$

$$r \perp \text{span}(x_0, \ldots, x_{m-1})$$

Define the companion matrix C by (3.6) and find its eigenvalues and eigenvectors $$C = T^{-1} \Lambda T, \; \Lambda = \text{diag}(\lambda_1, \ldots, \lambda_m), \quad (13)$$

where eigenvectors are columns of $T^{-1}$.

Define $v_j$ to be the columns of $V = KT^{-1}$:

If $x_j = A^j x_0$, then the empirical Ritz values $\lambda_j$ are the usual Ritz values of A after m steps of the Arnoldi method, and $v_j$ are the corresponding Ritz vectors. These, may provide good approximations of the eigenvalues and eigenvectors of A. However, if we do not have $x_j = A^j x_0$ (for instance, if the sequence is generated by a nonlinear map), then at this point, it is not clear what the above algorithm produces. For a nonlinear system, the algorithm produces approximations of the Koopman modes and associated eigenvalues. A corresponding description for nonlinear systems may be found in (See, e.g. "Spectral Analysis of Nonlinear flows" Rowley, et al., Journal of Fluid Mechanics (2009), 641: 115-127), incorporated herein by reference.

In addition to the Arnoldi method, one skilled in the art will be familiar with other methods for calculating the Koopman Operator, such as those of Mezic, et al. A general discussion of the Mezic approach may be found in "Spectral Properties of Dynamical Systems, Model Reduction and Decompositions" Igor Mezic, Nonlinear Dynamics (2005) 41:309-325, incorporated herein by reference.

Parameter Sampling and Sensitivity Analysis

While the above spectral and energy-based methods may be used to determine characteristics of a sensor dataset, effective characterization of building behavior may also depend on selecting appropriate sensors and appropriate physical fields from which to collect data. Thus, independently or in conjunction with the above-described methods for data transformation and analysis, certain of the present embodiments contemplate a building management system which also identifies pertinent sensors and physical fields for analysis using a model of the building and certain decomposition methods described in greater detail below. A combined Koopman Analysis-Decomposition method is also discussed in greater detail below.

Figure 14:
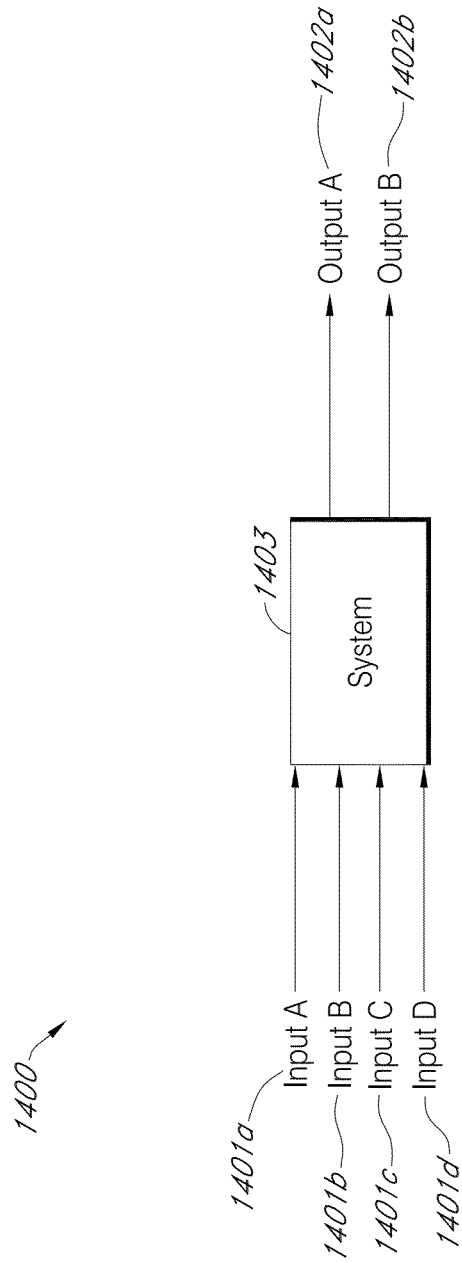
FIG. 14 comprises a generalized systems diagram for modeling a physical system as a series of inputs and a series of outputs.

FIG. 14 illustrates a system 1403 which receives a plurality of inputs 1401A-D and produces a plurality of outputs 1402A-B. System 1403 here represents a synthetic, computer model of a building, such as by using one of the Energy Plus, TRNSYS, or Equest models known to one skilled in the art. By varying inputs 1401A-D and monitoring the effect on outputs 1402A-B the relationships between the inputs and between the inputs and the outputs may be determined.

Decomposition methods comprise methods for reducing a complex arrangement of data to a more useful form, by recognizing which data components most greatly influence one another or one or more physical fields of interest. In the context of building efficiency, energy efficiency and environmental protection goals may be affected by a wide variety of distributed components in a system. Structural elements, communication systems, sensing systems, transportation systems, air quality systems, and power systems of a building may interact in a highly complex manner. The behavior of these components may be modeled in software. These energy simulation tools may comprise a suite of detailed physical relations (differential, algebraic, etc.) that describe the way various disturbances (from weather, humans, control systems, etc.) influence the thermodynamic behavior of a building. Within these equations, thousands of parameters, or inputs, may exist. At times these values may be supplied by the best-educated guesses of an analyst. Unfortunately, parameter errors may cause a tool which accurately represents real-world behavior to produce erroneous results.

With respect to FIG. 14, it would be desirable to select a range of values for each input 1401A-D and an associated granularity. Then, computer simulations may be run at each of the input value iterations and the resulting outputs observed. For example, for an input comprising the length of a window shade, the range would be the distance in feet from no extension (0 feet) to full extension (4 feet) of the window shade. As the range from 0-4 comprises an infinite number of intermediate values, the analyst may select discrete values for a particular granularity. For example, a granularity of one foot may be selected so that the collection of input values considered is 0, 1, 2, 3, and 4 feet. For all the inputs, an analyst may iterate between each of these values and run a corresponding simulation to generate corresponding outputs 1402A-B. By observing the outputs 1402A-B when iterating through every possible combination of input values, the analyst may infer relations between each of the inputs and between the inputs and the output. In some simulations not all parameters change individually (one at a time). In others, the parameters may change all at once (which may be more efficient computationally). Certain systems may adjust the granularity as yet another input to determine how the model reacts, and need not select an evenly distributed granularity within the range as in this example.

Figure 15:
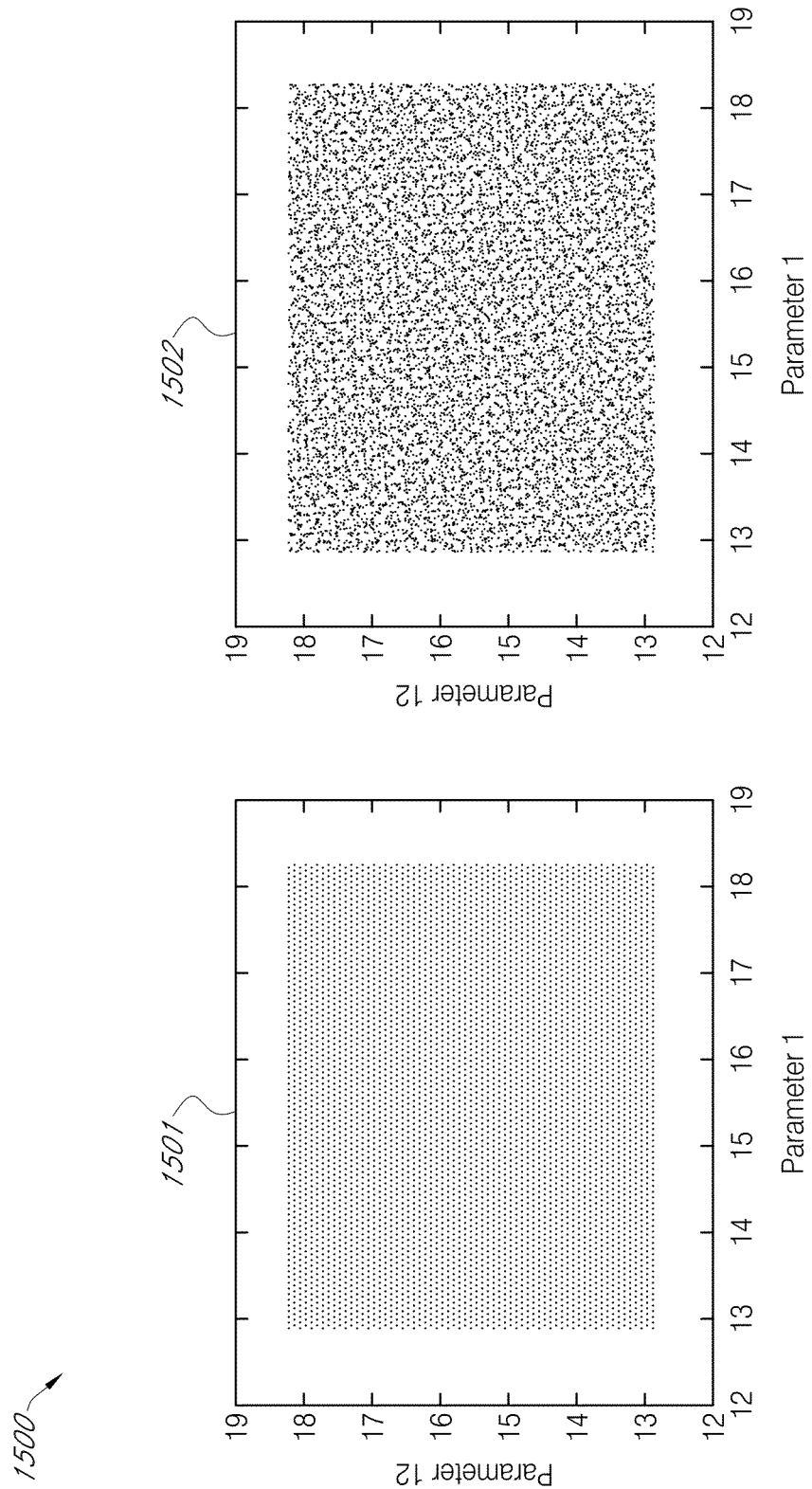
FIG. 15 comprises a side-by-side comparison of a deterministic sampling technique and traditional sampling using a Monte Carlo technique.

In fact, as the choice of parameter range and distribution will influence the sampled behavior of the building model, certain embodiments consider selecting ranges and distributions using pseudo-random and random techniques. FIG. 15 illustrates the results of a deterministic sampling method using traditional sampling techniques 1501 as compared to using a random technique, such as Monte Carlo 1502. Certain of the present embodiments contemplate using either sampling method.

In deterministic sampling, instead of randomly selecting the next point to sample, an equation may be used to find the next sample point. Such an equation can be written as $$x' = T(x) \qquad (14)$$

where x' denotes the next sampling location and T(x) describes a mapping of the previous sampling location x. If such mapping T is uniformly ergodic, then good convergence properties of sampling may be obtained. Random sampling methods instead select the next point using a randomness algorithm such as Monte Carlo. In the traditional methods (Monte Carlo), clumping may occur in the sampling approach. These clumped sampled points may indicate inefficiency in the sampling approach and waste time in the analysis of the building design. Latin hypercube sampling (LHS) may be used to initially partition the space into equally probable areas prior to taking random samples to avoid this problem.

Certain embodiments combine the use of Monte Carlo and Quasi-Monte Carlo (i.e. deterministic) methods which may be much faster and more exact than using Monte Carlo methods alone. Quasi-random sampling methods may provide a faster convergence rate and fewer simulations to obtain the same accuracy that other methods offer. This may allow more uncertain parameters to be handled in the same amount of time.

Uncertainty and Sensitivity Analysis

Generally, an analyst may not know the exact range of values for a given input and must instead make an uncertain guess. Uncertainty analysis comprises the quantification of how uncertainty of the inputs 1401A-D influences the uncertainty of the outputs 1403A-B. Sensitivity analysis identifies how uncertainty in an output 1403A-B can be allocated to the uncertainty of input parameters 1401A-D in a process or model. Uncertainty analysis may generally be thought of as a "bottom-up" assessment of data character whereas sensitivity analysis comprises a "top-down" assessment. While an analyst could measure uncertainty from a simplistic topology such as FIG. 14, certain of the present embodiments contemplate a hierarchical arrangement of the data inputs to better determine their relations to one another and to the outputs AA03A-B. Uncertainty may be characterized using derivatives, intervals, variance, etc. or any other varying quantity. In some embodiments, uncertainty and sensitivity analysis may comprise one of three approaches: parameter screening, local sensitivity methods and global methods. Each of these approaches differ in their complexity and accuracy.

Parameter screening is a coarse one parameter at a time (OAT) approach that investigates extreme values of the parameters and quickly identifies how they influence the output by ranking them in order of importance. This method is good for studying models with a few uncertain parameters.

Local sensitivity methods use numerical approximations of local derivatives between the output and input to estimate parameter sensitivity. There are a few different approaches to calculate this derivative (finite difference, direct methods, using Green functions, etc.), but each method typically requires OAT sampling. Again, this method is good for studying a small number of uncertain parameters. As the name implies, local methods obtain only approximate sensitivity results at different locations in the sampled space.

In contrast, global methods calculate how the variance of the output varies due to the entire sampled range of the parameter space. Unlike local methods, the global approach does not assume linearity or monotonicity in the data or the process which produces it. The Morris method is one example of a global SA approach wherein randomized matrices are constructed with one parameter varying at a time. Derivative-based global sensitivity can be calculated from functions such as $$\mu_m = \int \left|\frac{\partial f}{\partial x_m}\right| dx \text{ or } v_m = \int \left|\frac{\partial f}{\partial x_m}\right|^2 dx \quad (15)$$

Where the integration is performed over all dimensions of the sampling points. Analysis of variance (ANOVA) and other sensitivities may be used to calculate the uncertainty.

Figure 16:
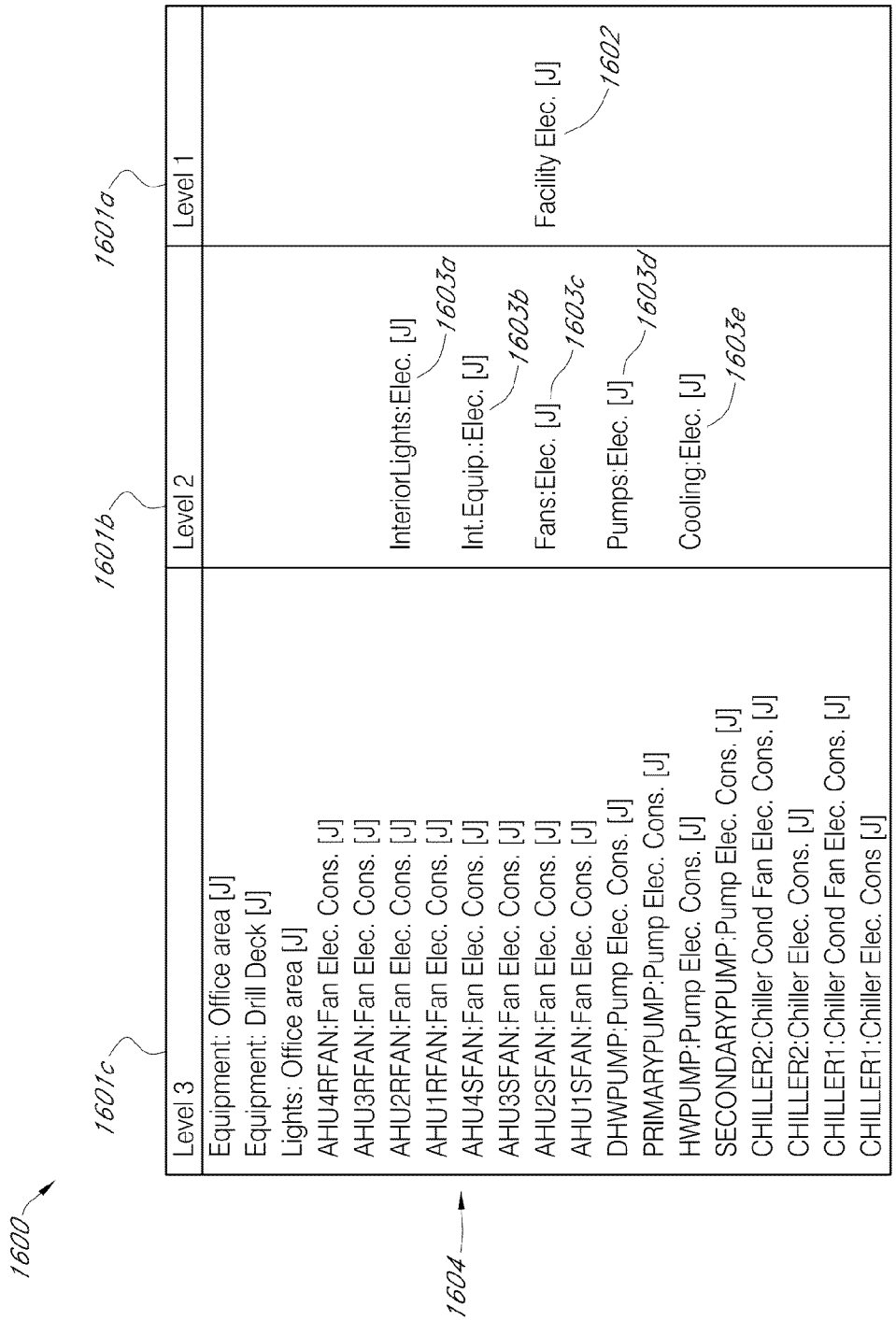
FIG. 16 is a table depicting various levels of decomposition variables in one possible sensitivity analysis.

FIG. 16 illustrates a decomposition hierarchy of the energy efficiency variable "Facility Electricity" 1602. Outputs may alternatively comprise values such as domestic hot water energy, air conditioning usage, electricity usage for a particular room, pump, fan, lighting system, chiller, cooling system etc. Intermediate variables 1603A-E may represent components contributing to the energy consumption of the energy efficiency variable "Facility Electricity" 1602. The system may be further broken down into variables 1604 which in turn influence each of the variables 1603A-E. The illustrated breakdown may be created by an analyst or building designer based on their intuitive understanding of the component relations and their expectations for the building's operations. The right-most node is the electricity use at the building level.

Figure 17:
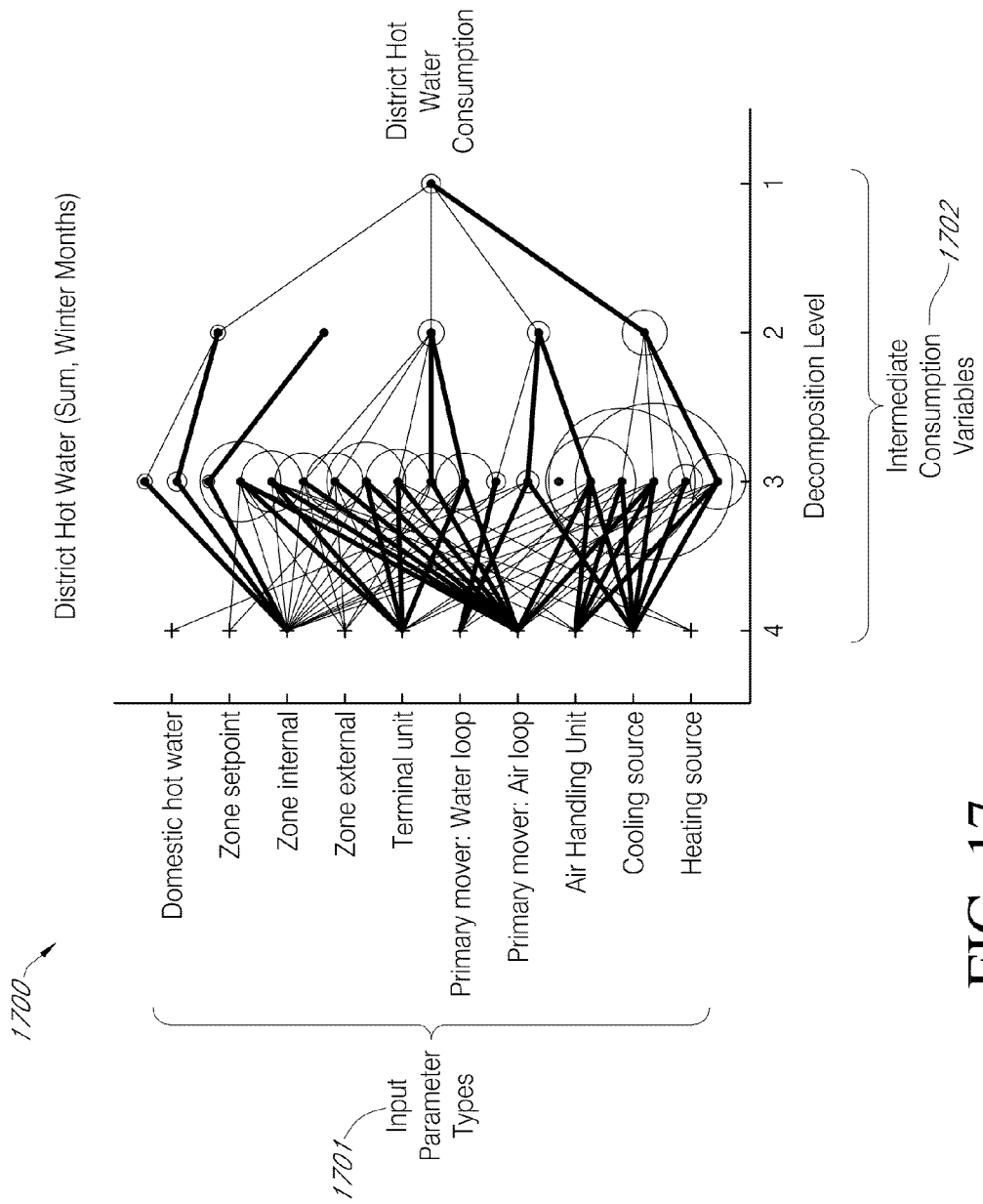
FIG. 17 is a visualization of the results of a decomposition operation as used in certain embodiments in the form of a decomposed sensitivity web.

By iterating through the value ranges of variables at one level and assessing the effect on variables at a higher level, (for example, iterating through values for variable 1604 and assessing the effect on the variables 1603A-E) a sensitivity web, illustrated in FIG. 17 may be generated. The web of FIG. 17 comprises four decomposition levels rather than the three of FIG. 17 and also addresses hot water consumption rather than facility electricity.

In FIG. 17, the nodes are subsystem energy variables, which are described in Table 1, and the connecting wires are sensitivity indices.

TABLE 1

Example parameter types selected for decomposition analysis

| Decomposition level | Type | Examples |
| --- | --- | --- |
| 1 | Heating source | District heating system (normal capacity, maximum hot water system temperature, loop flow rate, etc.) |

TABLE 1-continued

Example parameter types selected for decomposition analysis

| Decomposition level | Type | Examples |
| --- | --- | --- |
| 2 | Cooling source | Air cooled chiller (chiller reference capacity, reference COP, reference leaving chilled water temperature, etc.) |
| 3 | (Air Handling Unit) AHU | AHU (supply air temperature setpoint, cooling coil design flow rate, design inlet water temperature, design inlet air temperature, etc.) |
| 4 | Primary mover: air loop | Fans (efficiency, pressure rise, etc.) |
| 5 | Primary mover: water loop | Pumps (rated flow rate, rated head, rated power consumption, etc.) |
| 6 | Terminal unit | VAV boxes (maximum air flow rate, minimum air flow fraction, etc.), maximum zonal flow rates |
| 7 | Zone external | Building envelope (material thermal properties such as conductivity, density, and specific heat, window thermal and optic properties, etc.), outdoor conditions (ground temperature, ground reflectance, etc.) |
| 8 | Zone internal | Internal heat gains design level (lighting load, number of people, people activity level, etc.), schedules |
| 9 | Zone setpoint | Zone temperature setpoint (space cooling and heating setpoints) |
| 10 | Domestic hot water | Domestic hot water usage (peak flow rate, target temperature, etc.) |

The circles drawn around each of the nodes represent the coefficient of variation. In some embodiments the scales for the circles are arbitrary and are instead intended to be viewed relative to other circles in the figure. The circles around the nodes illustrate the uncertainty in each node, while the edges between the nodes illustrate the influence between the nodes. The thickness of the wires corresponds to the magnitude of the sensitivity index. Thicker edges indicate more influence, while thinner edges indicate less influence. These edges are referred to as "sensitivity indices". Where there is no wire, the sensitivity index is negligible, and conversely the thickest wires represent the strongest influence between the variables.

In certain embodiments the system generates the web 1700 by first iterating through each decomposition level of FIG. 16 (from left to right) and performing an uncertainty analysis for each output based on the collection of inputs (thereby generating the circles 1704A-B). Once the uncertainty analysis is complete, the system may then calculate the sensitivity indices 1703A-B. Once the uncertainty analyses have been performed for each level and the corresponding circles generated, the system may then perform a sensitivity analysis to determine the wire thickness between each component.

Certain embodiments contemplate an improved approach for simulating building dynamics, by integrating various of the above techniques. In these embodiments, quasi-random sampling may be used to generate the parameter samples. A response surface may then be calculated using support vector regression using Gaussian kernels. ANOVA and L2 norm derivative-based sensitivities may then be calculated. In some embodiments, only L1 norm (mm) derivative-based sensitivities are presented.

Summary of Certain Sensitivity Embodiments

Figure 18:
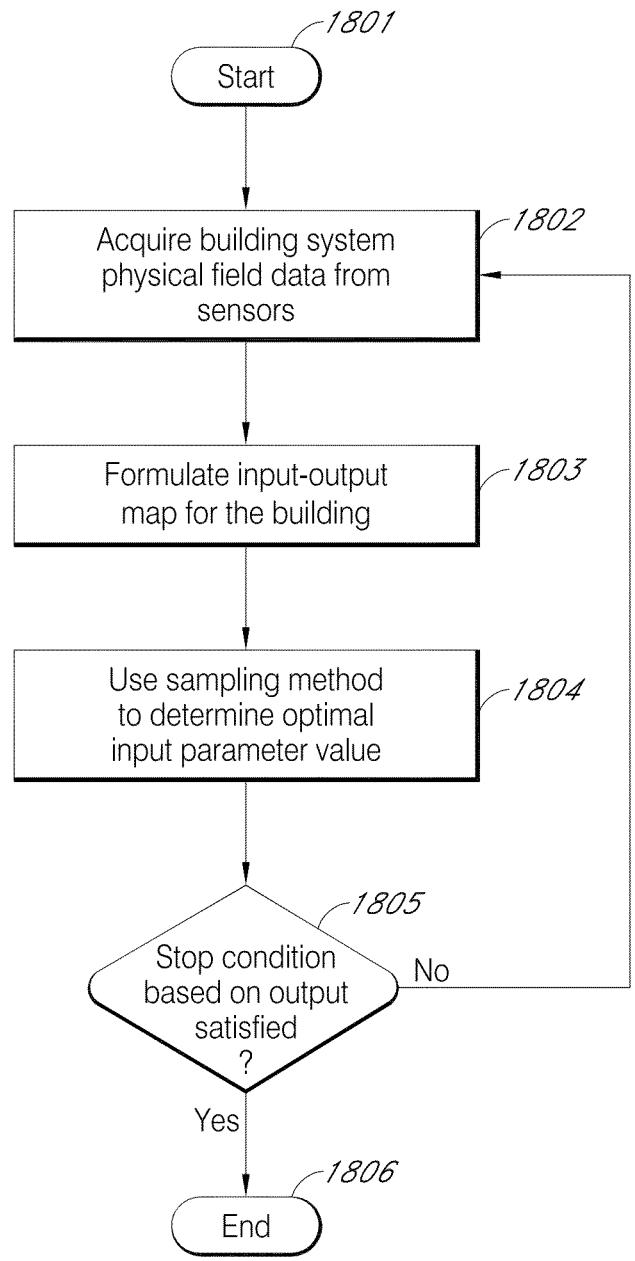
FIG. 18 is a logical flow diagram general describing sensitivity analysis as used in certain embodiments.

FIG. 18 is a logical flow diagram generally describing sensitivity analysis as used in certain embodiments. In these embodiments, the system begins 1801 by acquiring the physical field data from the building 1802. As mentioned, the building may be either real or synthetic and the sensor data real or simulated or comprising a combination of the two. The system or user may then formulate an input-output map 1803 for the building. For example, the system or user may specify the components of the decomposition hierarchy described above with respect to FIG. 16. Such a selection may be based on properties of the building architecture or assumed relationships between building components. Although described here in this order, one may readily recognize that the data acquired 1802 may be chosen based on the input-output map generated 1803. The system may then use the sampling method, such as the quasi-random methods discussed above, to determine the optimal input parameter value 1804. The optimal input parameter value may be used to determine if stop condition 1805 has been satisfied. For example, if the selected input reduces the real-world or modeled inefficiency below a specified level, the system may stop 1806 or delay further action. Conversely, if the building has not yet reached a desired operation the process may be repeated. Further discussion of uncertainty and sensitivity analysis may be found in "Coupled Nonlinear Dynamical Systems: Asymptotic Behavior and Uncertainty Propagation", Igor Mezic, $43^{rd}$ IEEE Conference on Decision and Control. Dec. 14-17, 2004 incorporated herein by reference and in "Uncertainty Analysis and Sensitivity Decomposition of Building Energy Models" Eisenhower, et al., Journal of Building Performance Simulation, Vol. 4, May 10, 2011, incorporated by reference herein.

Merged Koopman-Based Decomposition and Visualization

In lieu or in conjunction with the hierarchical decompositions discussed above, certain embodiments contemplate decomposition hierarchies which integrate aspects of the energy 810 or spectral 820 analysis methods into their structure. For example, with reference to FIG. 19, certain embodiments contemplate applying the decomposition framework discussed above with regard to the results of the Koopman-based analysis. As illustrated in FIG. 19, the first 1901*a*, second 1901*b*, third 1901*c*, and fourth 1901*d* order frequency components from the Koopman analysis may be hierarchically organized and the relations therebetween which affect a physical field of interest determined using the methods discussed above. Such an approach may be used in conjunction with the decomposition of FIG. 17 to determine correlations between hierarchical levels of decomposition and components of the frequency-based analysis. Other applications of spectral techniques in the context of uncertainty and sensitivity analysis may be found in "Spectral Balance: A Frequency Domain Framework for Analysis of Nonlinear Dynamical Systems", Banaszuk et al., $43^{th}$ IEEE Conference on Decision and Control, Dec. 14-17, 2004, incorporated herein by reference.

Integrated Whole-Building Design and Operation—GloBEMS

The methods above are preferably combined to provide an integrated system-wide design and operation methodology for the building. As discussed above, the spectral-spatial decomposition may be used on both raw building system data from an operating building, and upon model data. Furthermore, the propagation presented in FIG. 2 may be performed not only on model data but upon data from a building in operation as well.

As such, the combined portions of this method offer an approach for fault diagnosis and system-wide optimization of the building providing the most energy efficient design and operation approach available.

The global building energy management system provides a detailed visualization of energy use and waste, as well as clear, actionable intelligence that can be implemented with resultant energy savings. The global building energy management system also allows for a real-time, immediate determination of a return on investment for all energy decisions, e.g., upgraded equipment, additional management tools, etc., and enables significant energy savings within a single building or intra-building usage.

The use of the global building energy management system also allows for an analysis of how a building "breathes," i.e., where energy escapes from walls, where heat is lost or maintained, etc., which in turn leads to corrective actions for such energy loss. Further, the global building energy management system can be implemented in real-time to see how any corrective actions are working, extract correlations between spatial distribution of physical fields (that include temperature, humidity, airflow, pressure, people occupancy, plug load density, light intensity) and time-periodic patterns caused by building usage patterns, diurnal cycles and control system cycles, and based on such correlations provide methods for analysis that allow for more efficient use of energy within a structure.

The global building energy management system is enabled by algorithms that are tailored for analysis of large parameter dependent systems that contain many sensor-based output variables. Because of this, the approach allows the present invention to be orders of magnitude faster than the currently deployed attempts at optimization. Further, the global building energy management system takes into account a number of sensor generated data values that are orders of magnitude larger than numbers in current use, which allows for the accuracy of the system to be customer-specified rather than building design specified. The accuracy of the sensitivity analysis in the present invention has been shown to be on the order of 1 millionth of an energy unit, which is far smaller than current standards and deployed analysis tools.

The global building energy management system also allows for comprehensive situational analysis of large building energy systems, which includes initial energy audits, monthly updates of the audits, real-time monitoring and control via continuous commissioning through the building management system, as well as allowing building management, ownership, engineering or energy consulting firms to analyze and provide solutions for commercial buildings and complexes.

As used herein, "instructions" refer to computer-implemented steps for processing information in the system. Instructions can be implemented in software, firmware or hardware and include any type of programmed step undertaken by components of the system.

A "microprocessor" or "processor" may be any conventional general purpose single- or multi-core microprocessor such as a Pentium® processor, Intel® Core™, a 8051 processor, a MIPS® processor, or an ALPHA® processor. In addition, the microprocessor may be any conventional special purpose microprocessor such as a digital signal processor or a graphics processor. A "processor" may also refer to, but is not limited to, microcontrollers, field programmable gate arrays (FPGAs), application-specific integrated circuits (ASICs), complex programmable logic devices (CPLDs), programmable logic arrays (PLAs), microprocessors, or other similar processing devices.

The system is comprised of various modules as discussed in detail below. As can be appreciated by one of ordinary skill in the art, each of the modules comprises various sub-routines, procedures, definitional statements and macros. Each of the modules are typically separately compiled and linked into a single executable program. Therefore, the following description of each of the modules is used for convenience to describe the functionality of the preferred system. Thus, the processes that are undergone by each of the modules may be arbitrarily redistributed to one of the other modules, combined together in a single module, or made available in, for example, a shareable dynamic link library.

Certain embodiments of the system may be used in connection with various operating systems such as SNOW LEOPARD®, iOS®, LINUX, UNIX or MICROSOFT WINDOWS®.

Certain embodiments of the system may be written in any conventional programming language such as assembly, C, C++, BASIC, Pascal, or Java, and run under a conventional operating system.

In addition, the modules or instructions may be stored onto one or more programmable storage devices, such as FLASH drives, CD-ROMs, hard disks, and DVDs. One embodiment includes a programmable storage device having instructions stored thereon.

While the above processes and methods are described above as including certain steps and are described in a particular order, it should be recognized that these processes and methods may include additional steps or may omit some of the steps described. Further, each of the steps of the processes does not necessarily need to be performed in the order it is described.

While the above description has shown, described, and pointed out novel features of the invention as applied to various embodiments, it will be understood that various omissions, substitutions, and changes in the form and details of the system or process illustrated may be made by those skilled in the art without departing from the spirit of the invention. As will be recognized, the present invention may be embodied within a form that does not provide all of the features and benefits set forth herein, as some features may be used or practiced separately from others.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium may be coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

All of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors or circuitry or collection of circuits, e.g. a module) that executes program instructions or modules stored in a memory or other non-transitory computer-readable storage medium. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

What is claimed is:

1. A method for analyzing building sensor data, the method comprising:
   receiving building sensor data for a building, the data comprising a plurality of values over time for a plurality of sensors;
   determining phase and magnitude values associated with one or more sensors of the plurality of sensors based on a spectral analysis technique applied to the building sensor data; and
   generating a visualization based on at least one of the phase or magnitude values associated with the plurality of sensors, the visualization comprising an overlay upon a building floorplan, the overlay depicting at least one of the phase or magnitude values associated with the plurality of sensors,
   the method performed by a building energy management system comprising one or more computing devices.

2. The method of claim 1, wherein the method comprises determining energy values associated with one or more sensors based on an energy-based technique applied to the building sensor data.

3. The method of claim 2, wherein generating a visualization further comprises generating the visualization based on at least one of the phase, magnitude, or energy values associated with the plurality of sensors, the overlay depicting at least one of the phase, magnitude, or energy values associated with the plurality of sensors.

4. The method of claim 2, wherein the method comprises determining a time to activate or to deactivate an actuator based on at least one of the phase, magnitude, or energy values associated with the plurality of sensors.

5. The method of claim 1, wherein the spectral analysis technique comprises a Koopman-based technique.

6. The method of claim 2, wherein the energy-based technique comprises a Proper Orthogonal Decomposition.

7. The method of claim 1, wherein the building sensor data comprises data from a real-world building and data from a simulated model of the building, the method further comprising comparing at least one Koopman mode amplitude or phase obtained from real-world building sensor data with at least one Koopman mode amplitude or phase obtained from simulated model sensor data.

8. The method of claim 1, wherein the plurality of values over time comprises one of temperature values, humidity values, airflow values, pressure values, people occupancy values, plug load density values, and light intensity values.

9. The method of claim 1, further comprising:
   identifying a final output of interest based on the at least one of the phase or magnitude values;
   identifying a plurality of inputs affecting the final output of interest based on the at least one of the phase or magnitude values; and
   representing the final output and the plurality of inputs affecting the final output as a graph, the graph comprising an edge between a first input from the plurality of inputs affecting the final output and the final output, wherein a thickness of the edge corresponds to the influence of the first input upon the final output of interest.

10. An electronic apparatus for assessing building properties comprising:
a memory configured to store a data set, the data set comprising building sensor data, the building sensor data comprising a plurality of values over time for a plurality of sensors;
one or more processors; and
software, stored in a memory, configured to cause the one or more processors to determine phase and magnitude values associated with one or more sensors of the plurality of sensors based on a spectral analysis technique applied to the building sensor data; and
the software additionally configured to cause the one or more processors to generate a visualization based on at least one of the phase, magnitude, or energy values associated with the plurality of sensors, the visualization comprising an overlay upon a building floorplan, the overlay depicting at least one of the phase or magnitude values associated with the plurality of sensors.

11. The electronic apparatus of claim 10, wherein the one or more processors determine the energy values associated with one or more sensors based on an energy-based technique applied to the building sensor data.

12. The electronic apparatus of claim 11, wherein the one or more processors generate a visualization based on at least one of the phase, magnitude, or energy values associated with the plurality of sensors, the overlay depicting at least one of the phase, magnitude, or energy values associated with the plurality of sensors.

13. The electronic apparatus of claim 10, wherein the one or more processors determine a time to activate or to deactivate an actuator, based on at least one of the phase or magnitude values associated with the plurality of sensors.

14. The electronic apparatus of claim 10, wherein the spectral analysis technique comprises a Koopman-based technique.

15. The electronic apparatus of claim 11, wherein the energy-based technique comprises a Proper Orthogonal Decomposition.

16. The electronic apparatus of claim 10, wherein the building sensor data comprises data from a real-world building and data from a simulated model of the building, the software additional configured to cause the one or more processors to compare at least one Koopman mode amplitude or phase obtained from real-world building sensor data with at least one Koopman mode amplitude or phase obtained from simulated model sensor data.

17. The electronic apparatus of claim 10, wherein the plurality of values over time comprises one of temperature values, humidity values, airflow values, pressure values, people occupancy values, plug load density values, and light intensity values.

18. The electronic apparatus of claim 10, the software additionally configured to cause the one or more processors to:
identify a final output of interest based on the at least one of the phase or magnitude values;
identify a plurality of inputs affecting the final output of interest based on the at least one of the phase or magnitude values; and
represent the final output and the plurality of inputs affecting the final output as a graph, the graph comprising an edge between a first input from the plurality of inputs affecting the final output and the final output, wherein a thickness of the edge corresponds to the influence of the first input upon the final output of interest.

19. A non-transitory computer storage comprising instructions that direct a computing system comprising one or more computing devices to perform a process that comprises:
receiving building sensor data for a building, the data comprising a plurality of values over time for a plurality of sensors;
determining phase and magnitude values associated with one or more sensors of the plurality of sensors based on a spectral analysis technique applied to the building sensor data; and
generating a visualization based on at least one of the phase or magnitude values associated with the plurality of sensors, the visualization comprising an overlay upon a building floorplan, the overlay depicting at least one of the phase or magnitude values associated with the plurality of sensors.

20. An electronic apparatus for assessing building properties comprising:
means for storing a data set, the data set comprising building sensor data, the building sensor data comprising a plurality of values over time for a plurality of sensors;
processing means configured to determine, based on the dataset, phase and magnitude values associated with one or more sensors of the plurality of sensors based on a spectral analysis technique applied to the building sensor data; and
the processing means additionally configured to generate a visualization based on at least one of the phase or magnitude values associated with the plurality of sensors, the visualization comprising an overlay upon a building floorplan, the overlay depicting at least one of the phase or magnitude values associated with the plurality of sensors.

21. The electronic apparatus of claim 20, wherein the processing means comprises one or more processors.

22. The non-transitory computer storage of claim 19, wherein the process further comprises determining energy values associated with each sensor of the plurality of sensors based on an energy-based technique applied to the building sensor data.

23. The non-transitory computer storage of claim 19, wherein the process further comprises determining a time to activate or to deactivate an actuator, based on at least one of the phase or magnitude values associated with a plurality of sensors.

24. The electronic apparatus of claim 20, wherein the processing means is additionally configured to determine energy values associated with each sensor of the plurality of sensors based on an energy-based technique applied to the building sensor data.

25. The electronic apparatus of claim 20, wherein the processing means is additionally configured to determine a time to activate or to deactivate an actuator, based on at least one of the phase or magnitude values associated with a plurality of sensors.

* * * * *